United States Patent
Tang

(10) Patent No.: US 9,437,816 B2
(45) Date of Patent: *Sep. 6, 2016

(54) PHASE CHANGE MEMORY STRUCTURES AND METHODS

(71) Applicant: Micron Technology, Inc., Boise, ID (US)

(72) Inventor: Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/812,284

(22) Filed: Jul. 29, 2015

(65) Prior Publication Data

US 2015/0349248 A1    Dec. 3, 2015

Related U.S. Application Data

(60) Continuation of application No. 14/051,212, filed on Oct. 10, 2013, now Pat. No. 9,130,163, which is a division of application No. 12/872,945, filed on Aug. 31, 2010, now Pat. No. 8,574,954.

(51) Int. Cl.
| | |
|---|---|
| *H01L 45/00* | (2006.01) |
| *H01L 27/24* | (2006.01) |
| *G11C 13/00* | (2006.01) |

(52) U.S. Cl.
CPC ....... *H01L 45/1253* (2013.01); *H01L 27/2409* (2013.01); *H01L 27/2463* (2013.01);
(Continued)

(58) Field of Classification Search
CPC ............. H01L 45/1233; H01L 45/124; H01L 45/1246; H01L 45/1253; H01L 27/24; H01L 27/2409; H01L 27/2463
See application file for complete search history.

(56) References Cited

U.S. PATENT DOCUMENTS

| | | |
|---|---|---|
| 6,746,910 B2 | 6/2004 | Hsu et al. |
| 7,045,383 B2 | 5/2006 | Maimon et al. |

(Continued)

FOREIGN PATENT DOCUMENTS

| | | |
|---|---|---|
| JP | 2004128486 A | 4/2004 |
| JP | 2006019688 A | 1/2006 |

(Continued)

OTHER PUBLICATIONS

Decision of Rejection from related Chinese patent application No. 201180045419.3, dated Sep. 6, 2015, 24 pp.

(Continued)

*Primary Examiner* — Allison P Bernstein
(74) *Attorney, Agent, or Firm* — Brooks, Cameron & Huebsch, PLLC

(57) ABSTRACT

A method of forming a phase change material memory cell includes forming a number of memory structure regions, wherein the memory structure regions include a bottom electrode material and a sacrificial material, forming a number of insulator regions between the number of memory structure regions, forming a number of openings between the number of insulator regions and forming a contoured surface on the number of insulator regions by removing the sacrificial material and a portion of the number of insulator regions, forming a number of dielectric spacers on the number of insulator regions, forming a contoured opening between the number of insulator regions and exposing the bottom electrode material by removing a portion of the number of dielectric spacers, and forming a phase change material in the opening between the number of insulator regions.

18 Claims, 25 Drawing Sheets

X-X Section

(52) U.S. Cl.
CPC ............... *H01L45/04* (2013.01); *H01L 45/06* (2013.01); *H01L 45/1233* (2013.01); *H01L 45/14* (2013.01); *H01L 45/144* (2013.01); *H01L 45/148* (2013.01); *H01L 45/1675* (2013.01); *H01L 45/1683* (2013.01); *G11C 13/0004* (2013.01)

(56) References Cited

U.S. PATENT DOCUMENTS

| | | | |
|---|---|---|---|
| 7,173,271 | B2 | 2/2007 | Chang |
| 7,295,463 | B2 * | 11/2007 | Yang .................. G11C 13/0004 257/2 |
| 7,323,349 | B2 | 1/2008 | Hsu et al. |
| 7,442,602 | B2 | 10/2008 | Park et al. |
| 7,473,597 | B2 | 1/2009 | Lee et al. |
| 7,551,473 | B2 | 6/2009 | Lung et al. |
| 7,666,578 | B2 | 2/2010 | Fischer et al. |
| 7,732,343 | B2 | 6/2010 | Niroomand et al. |
| 7,816,661 | B2 | 10/2010 | Lai et al. |
| 8,133,757 | B2 | 3/2012 | Kwon et al. |
| 2006/0237756 | A1 | 10/2006 | Park et al. |
| 2007/0205438 | A1 | 9/2007 | Juengling |
| 2007/0296039 | A1 | 12/2007 | Chidambarrao et al. |
| 2008/0029752 | A1 * | 2/2008 | Karpov .................. H01L 45/04 257/2 |
| 2008/0142776 | A1 | 6/2008 | Seidl |
| 2008/0164453 | A1 | 7/2008 | Breitwisch |
| 2008/0191188 | A1 | 8/2008 | Jeong |
| 2008/0265239 | A1 | 10/2008 | Philipp et al. |
| 2009/0196091 | A1 | 8/2009 | Kau et al. |
| 2010/0061145 | A1 | 3/2010 | Weis |
| 2010/0207095 | A1 | 8/2010 | Lai et al. |

FOREIGN PATENT DOCUMENTS

| | | |
|---|---|---|
| JP | 2006060235 A | 3/2006 |
| JP | 2006313898 A | 11/2006 |
| JP | 2008198979 A | 8/2008 |
| JP | 2009010337 A | 1/2009 |
| KR | 10-2004-0054250 A | 6/2004 |
| KR | 1020040047272 A | 6/2004 |
| KR | 10-2009-0017087 A | 2/2009 |
| KR | 10-2009-0113675 A | 11/2009 |
| KR | 20100063937 A | 6/2010 |

OTHER PUBLICATIONS

Notice of Rejection from related Japanese patent application No. 2013-525894, dated Aug. 11, 2015, 8 pp.

Second Office Action from related Chinese patent application No. 201180045419.3, dated Feb. 28, 2015, 22 pp.

Notice of Initiation of Examination by Administrative Patent Judges from related Japanese patent application No. 2013-525894, dated Nov. 18, 2014, 5 pp.

Office Action from related Taiwan patent application No. 100131351, dated Aug. 26, 2014, 9 pp.

Notice of Rejection Ground from related Japanese patent application No. 2013-525894, dated Jul. 1, 2014, 7 pp.

Notice of Final Rejection from related Korean patent application No. 10-2013-7007953, dated Aug. 14, 2014, 7 pp.

First Office Action from related Chinese patent application No. 201180045419.3, dated Jun. 30, 2014, 22 pp.

Kai-Liang Zhang, et al. "Study on Chemical Mechanical Polishing of GeSbTe for Chalcogenide Phase Change Memory", IEEE 2006 (3 pgs.).

Kwang-Jin Lee, et al. "A 90 nm 1.8 V 512 Mb Diode-Switch PRAM With 266 MB/s Read Throughput", IEEE Journal of Solid-State Circuts, vol. 43, No. 1, Jan. 2008 (13 pgs.).

International Search Report and Written Opinion for related PCT Application No. PCT/US2011/001483, Mailed Apr. 6, 2012, (13 pages).

Notice of Preliminary Rejection from related Korean patent application No. 10-2013-7007953, dated Feb. 20, 2014, 9 pp.

Notice of Rejection Grounds from related Japanese patent application No. 2013-525894, dated Feb. 26, 2014, 9 pp.

* cited by examiner

X-X Section

Y-Y Section

X-X Section

Y-Y Section

X-X Section

Y-Y Section

X-X Section

Y-Y Section

X-X Section

Y-Y Section

X-X Section

Y-Y Section

X-X Section

X-X Section

Y-Y Section

X-X Section

Y-Y Section

X-X Section

Y-Y Section

X-X Section

Y-Y Section

X-X Section

PHASE CHANGE MEMORY STRUCTURES AND METHODS

PRIORITY INFORMATION

This application is a Continuation of U.S. application Ser. No. 14/051,212 filed Oct. 10, 2013, which is a Divisional of U.S. application Ser. No. 12/872,945 filed Aug. 31, 2010, now U.S. Pat. No. 8,574,954, the specifications of which are incorporated herein by reference.

TECHNICAL FIELD

The present disclosure relates generally to semiconductor memory devices and methods, and more particularly, to phase change memory structures and methods.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among other types of memory.

Resistance variable memory devices, such as PCRAM devices, can include a structural phase change material such as a chalcogenide alloy, for instance, which can be programmed into different resistivity states to store data. The phase change memory cells are nonvolatile and the particular data stored in a phase change memory cell can be read by sensing the cell's resistance, e.g., by sensing current and/or voltage variations based on the resistance of the phase change material.

In cases in which the resistance variable memory device includes a chalcogenide alloy, the chalcogenide alloy can exhibit a reversible structural phase change, e.g., from amorphous to crystalline. A small volume of the chalcogenide alloy can be integrated into a circuit that can allow the cell to act as a fast switching programmable resistor. This programmable resistor can exhibit a greater dynamic range of resistivity between the crystalline state (low resistivity) and the amorphous state (high resistivity), and is also capable of exhibiting multiple intermediate states that allow multi-bit storage in each cell. That is, resistance variable memories may achieve multi-level cell (MLC) functionality via programming of memory cells to one of a number of different resistance levels.

The reliability of phase change memory cells over time can be affected by various factors such as the isolation between the phase change memory cell in an array and underlying substrate and/or the current densities used to provide sufficient power to alter the phase change material, among other factors. As an example, parasitic resistance can be introduced to a cell from adjacent cells that are not properly isolated. This parasitic resistance can cause undesired electro-migration in conductive materials of a phase change memory cell and may cause phase separation in the phase change material, in some instances.

BRIEF DESCRIPTION OF THE DRAWINGS

FIGS. 2A-1, 2A-2, 2A-3, 2B-1, 2B-2, 2B-3, 2C-1, 2C-2, 2C-3, 2D-1, 2D-2, and 2D-3 illustrate process steps associated with forming phase change memory cells in accordance with embodiments of the present disclosure.

FIG. 3 is a schematic of a portion of a phase change memory array in accordance with embodiments of the present disclosure.

DETAILED DESCRIPTION

Figures 1, 1A:
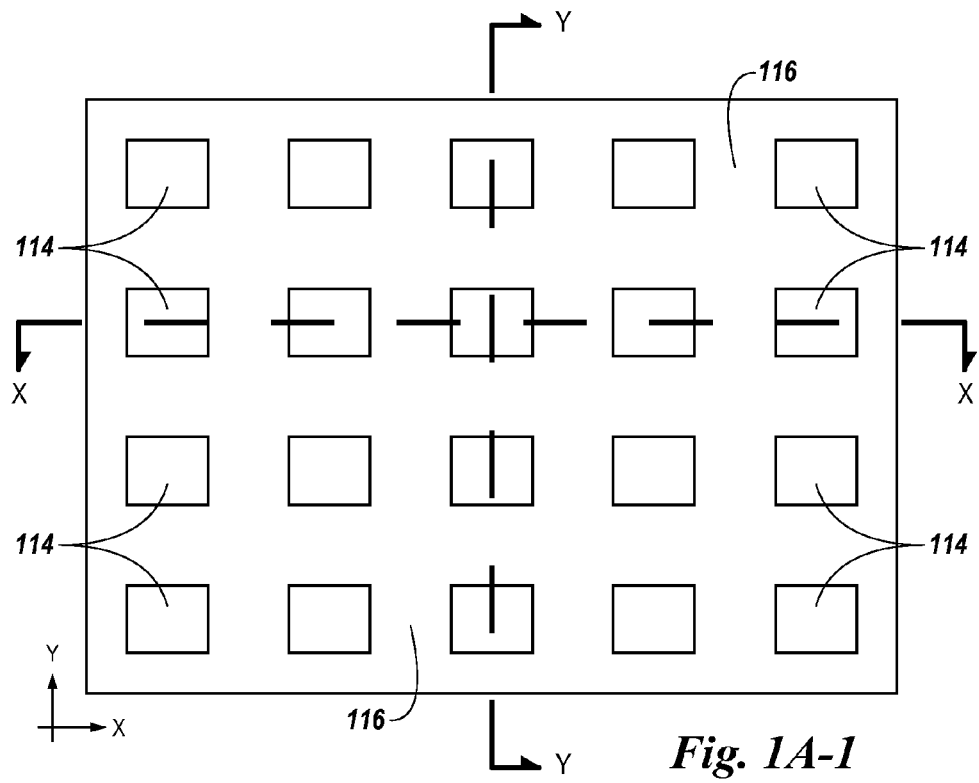
FIGS. 1A-1, 1A-2, 1A-3, 1B-1, 1B-2, 1B-3, 1C-1, 1C-2, 1C-3, 1D-1, 1D-2, 1D-3, 1E-1, 1E-2, 1E-3, 1F-1, 1F-2, 1F-3, 1G-1, 1G-2, 1G-3, 1H-1, 1H-2, and 1H-3 illustrate process steps associated with forming phase change memory cells in accordance with embodiments of the present disclosure.

Methods, devices, and systems associated with phase change material memory are described herein. In one or more embodiments, a method of forming a phase change material memory cell includes forming a number of memory structure regions, wherein the memory structure regions include a bottom electrode material and a sacrificial material, forming a number of insulator regions between the number of memory structure regions, forming a number of openings between the number of insulator regions and forming a contoured surface on the number of insulator regions by removing the sacrificial material and a portion of the number of insulator regions, forming a number of spacers on the number of insulator regions, forming a contoured opening between the number of insulator regions and exposing the bottom electrode material by removing a portion of the number of spacers, and forming a phase change material in the opening between the number of insulator regions.

One or more embodiments of the present disclosure can provide benefits such as reducing the parasitic resistance between phase change memory cells in an array. For instance, one or more embodiments can provide the ability to isolate the contact between the bottom electrode and the phase change material and the contact between the phase change material and the top electrode, thus reducing the parasitic resistance in a phase change memory cell caused by current applied to neighboring phase change memory cells. One or more embodiments of the present disclosure can provide a self-aligned contact and a self-aligned contact area for the bottom electrode and the phase change material and/or for the top electrode and the phase change material. In some embodiments of the present disclosure, the phase change memory arrays can be formed to allow for pitch doubling as compare to prior approaches of forming phase change memory arrays.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 116 may reference element "16" in FIG. 1A, and a similar element may be referenced as 216 in FIG. 2A. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

Figures 1, 1A, 2:
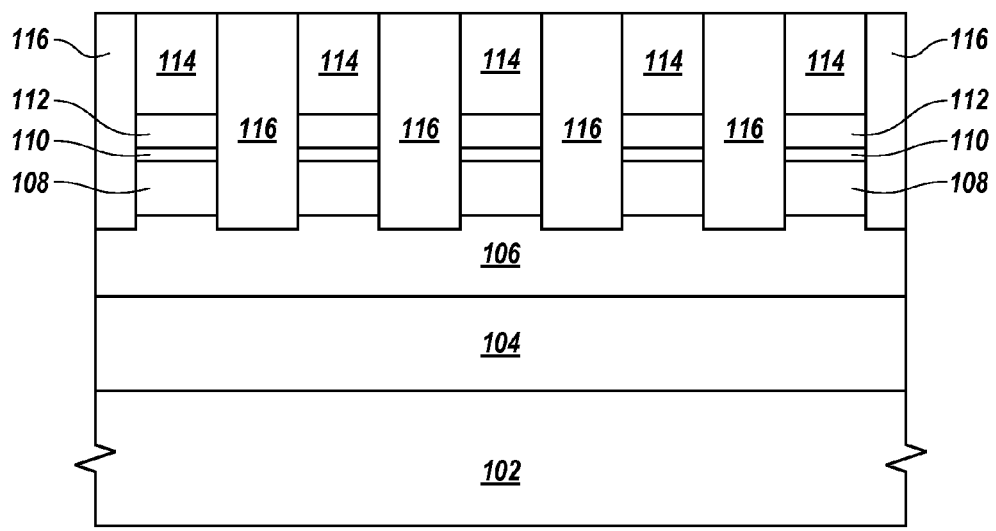

FIGS. 1A-1H illustrate process steps associated with forming phase change memory cells in accordance with embodiments of the present disclosure. In FIGS. 1A-1H and FIGS. 2A-2D, for each sub-figure, e.g., 1A, 1B, . . . , 1H and 2A, 2B, . . . , 2D, there are three views. For instance, FIG. 1A-1 is a top view and FIG. 1A-2 is a cross-sectional view taken along the line x-x shown in FIG. 1A-1. FIG. 1A-3 is a cross-sectional view taken along line y-y show in FIG. 1A-1. The phase change memory array illustrated in FIGS. 1A-1H can be formed with a cross-point architecture, but embodiments of the present disclosure are not limited to such architectures.

The memory structure shown in FIGS. 1A-1H includes a base semiconductor structure that includes a substrate 102 and a buried oxide (BOX) 104. The substrate 102 can be a silicon substrate, silicon on insulator (SOI) substrate, or silicon on sapphire (SOS) substrate, among others. Silicon implanted with phosphorus or arsenic, among other elements, can be used to form an N+/N− region 106 of an access device, such as a diode, and an access line, for example a word line, for the memory structures. Silicon, which can be epitaxially grown, can be formed over the N+/N− region 106 and implanted with boron, or other suitable material, to form a positive (P+) region 108 of the access device for the memory structures.

The bottom electrode material 112 can be formed over the P+ region 108. The bottom electrode material 112 can be titanium (Ti), tungsten (W), and/or titanium nitride (TiN), for example. In some embodiments, an adhesion improvement material 110, which can improve adhesion of the bottom electrode to the P+ region 108, can be formed over the P+ region 108. The adhesion improvement material 110 can be metal mode titanium (MMTi), titanium nitride (TiN), titanium rich TiN, titanium silicon (TiSix), among other materials. A sacrificial material 114, such as polysilicon, can be formed over the bottom electrode material 112. In some embodiments, the sacrificial material 114 can be approximately 600-1000 angstroms (Å) thick. As illustrated in the cross-sectional views in FIGS. 1A-2 and 1A-4, portions of the sacrificial material 114, the bottom electrode material 112, the adhesion improvement material 110, the P+ region 108, the N+/N− region 106, and the BOX 104 can be removed along the x axis to pattern the phase change memory array. The removal of material can remove a portion of the BOX 106 and can stop in and/or on the BOX 106. Portions of the sacrificial material 114, the bottom electrode material 112, the adhesion improvement material 110, the P+ region 108, and the N+/N− region 106 can be removed along the y-axis to pattern the phase change memory array. The removal of material can remove a portion of the N+/N− region 106 and stop in the N+/N− region 106, which can define individual diodes for each memory cell of the memory array.

In some embodiments, the sacrificial material 114, the bottom electrode material 112, the adhesion improvement material 110, the P+ region 108, the N+/N− region 106, and BOX 104 can be removed by reactive ion etching (RIE). The openings created by removing portions of the sacrificial material 114, the bottom electrode material 112, the adhesion improvement material 110, the P+ region 108, the N+/N− region 106, and the BOX 104 can be filled with an dielectric 116, as illustrated in FIGS. 1A-1, 1A-2, 1A-3, and 1A-4. Dielectric 116 can be boron-doped phosphor silicate glass (BPSG), a high aspect ratio process dielectric (HARP), and/or a spin-on dielectric (SOD), among other dielectric materials and formation processes. Removing portions of sacrificial material 114, the bottom electrode material 112, the adhesion improvement material 110, the P+ region 108, the N+/N− region 106, and the BOX 104 can further define memory structure regions. Filling openings with dielectric 116 can create insulator regions that separate the memory structure regions from each other and each memory structure region can include a memory cell after further process steps, which are described below.

FIGS. 1B-1, 1B-2, 1B-3, and 1B-4 illustrate further process steps in forming phase change memory cells in accordance with embodiments of the present disclosure. As illustrated in FIGS. 1B-2 and 1B-4, a portion of the sacrificial material 114 and dielectric 116 can be removed. The removal of a portion of the dielectric 116 can create a contoured shape for the insulator regions that include dielectric 116. The removal of a portion of the dielectric 116 can also define the contact area for the bottom electrode 112 and the phase change material by creating and defining an opening in which to form the phase change material. In some embodiments, approximately ⅓ of the sacrificial material 114 can be removed via RIE and a portion of the dielectric 116 can be removed to contour the dielectric 116 via physical plasma faceting, among other methods.

FIGS. 1C-1, 1C-2, 1C-3, and 1C-4 illustrate further process steps in forming phase change memory cells in accordance with embodiments of the present disclosure. As illustrated in FIGS. 1C-2 and 1C-4, dielectric 116 and the sacrificial material 114 can be further contoured and removed. Dielectric 116 can be cleaned and removed with a diluted hydrofluoric acid to further contour the dielectric 116. The remaining sacrificial material 114 can be removed via trimethane ammonium hydroxide (TMAH) etching, among other methods. Cleaning the dielectric 116 with diluted hydrofluoric acid to further contour the dielectric 116 and removing the sacrificial material 114 via TMAH etching can define the vertical sidewall contact area in the opening created by the hydrofluoric acid cleaning and the TMAH etching.

FIGS. 1D-1, 1D-2, 1D-3, and 1D-4 illustrate further process steps in forming phase change memory cells in accordance with embodiments of the present disclosure. Spacers 120 can be formed on the dielectric 116. The spacers 120 can define the contact area for the bottom electrode material 112. The spacers 120 can also create a contoured profile for the opening between the insulator regions and can define the size of the opening between the insulator regions where the phase change material can be formed, e.g., contact area for the bottom electrode material and the phase change material. Spacers 120 can be formed with various suitable materials, e.g., a suitable dielectric.

FIGS. 1E-1, 1E-2, 1E-3, and 1E-4 illustrate further process steps in forming phase change memory cells in accordance with embodiments of the present disclosure. As illustrated, phase change material 122 can be formed in the opening between the insulator regions 116. The phase change material 122 can contact the bottom electrode material 112 in the opening. The contact area for the phase change material 122 and the bottom electrode material 112 can be determined by the amount of dielectric removed during previous process steps and by the size of the spacers 120 formed over the insulator regions. In some embodiments, the contact area between the bottom electrode 112 and the phase change material 122 is defined by the distance between the number of insulator regions and/or the number of spacers on the insulator regions. The phase change material 122 can be formed in the opening by physical vapor deposition (PVD) and chemical mechanical planariztion (CMP) can be used to remove a portion of the phase change material 122 to the top of the dielectric 116.

FIGS. 1F-1, 1F-2, 1F-3, and 1F-4 illustrate further process steps in forming phase change memory cells in accordance with embodiments of the present disclosure. As illustrated, a nitride material 124 can be formed over the phase change material 122 and the dielectric 116. The nitride material 124 can be used as an etch stop in future processing steps. Tetraethyl orthosilicate (TEOS) 126 can be form over the nitride material 124. The thickness of the TEOS can determine the thickness of the bit line that is formed in future process steps.

FIGS. 1G-1, 1G-2, 1G-3, and 1G-4 illustrate further process steps in forming phase change memory cells in accordance with embodiments of the present disclosure. As shown, a portion of the TEOS 126 can be removed, e.g., via photo patterning and etching by RIE. The removal of the TEOS 126 does not remove the nitride material 124. The TEOS is removed along the y-axis over the phase change material 122. The nitride material 124 is also removed via a nitride punch where the TEOS above it has been removed to expose the phase change material 122.

FIGS. 1H-1, 1H-2, 1H-3, and 1H-4 illustrate further process steps in forming phase change memory cells in accordance with embodiments of the present disclosure. As shown, the top electrode material 128 can be formed in the openings formed by removing the TEOS and the nitride material as discussed above. The top electrode material 128 can be titanium nitride (TiN) or tungsten (W), among other materials. The top electrode material 128 can be the top electrode for the memory cells in the memory array and can serve as the bit line for the memory cells.

FIGS. 2A-2D illustrate process steps associated with forming phase change memory cells in accordance with embodiments of the present disclosure. In the embodiment illustrated in FIGS. 2A-2D, a conductive material 230 is formed in the opening between the insulator regions 216 and the phase change material 222 is formed over the conductive material 230. The contact between the phase change material 222 and the bottom electrode 212 is via the conductive material 230. The process steps illustrated in FIGS. 2A-2D start after the process steps discussed above in association with FIGS. 1A-1D.

FIGS. 2A-1, 2A-2, 2A-3, and 2A-4 illustrate further process steps in forming phase change memory cells in accordance with embodiments of the present disclosure. As shown, conductive material 230 can be formed in the opening between the insulator regions 216. The conductive material 230 can contact the bottom electrode material 212 in the opening. The contact area for the conductive material 230 and the bottom electrode material 212 can be determined by the amount of dielectric removed during process steps and the size of the spacer 220 formed over the insulator regions 216. The conductive material 230 can be formed in the opening by PDV and chemical mechanical planarization (CMP) can be used to remove a portion of the conductive material 230 to the top surface of the dielectric 216.

Figures 1, 1A, 2, 3:
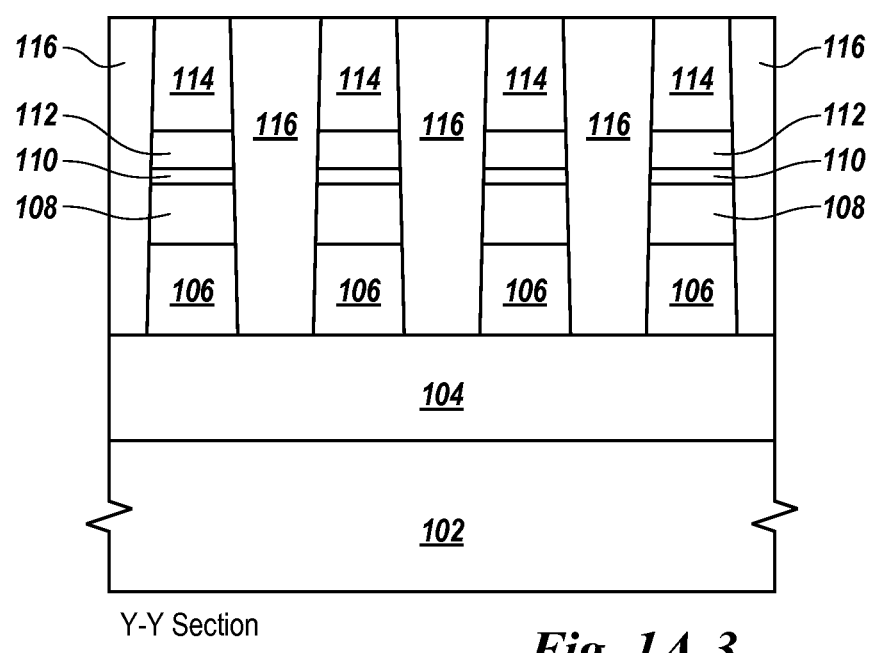
Figures 1, 1B:
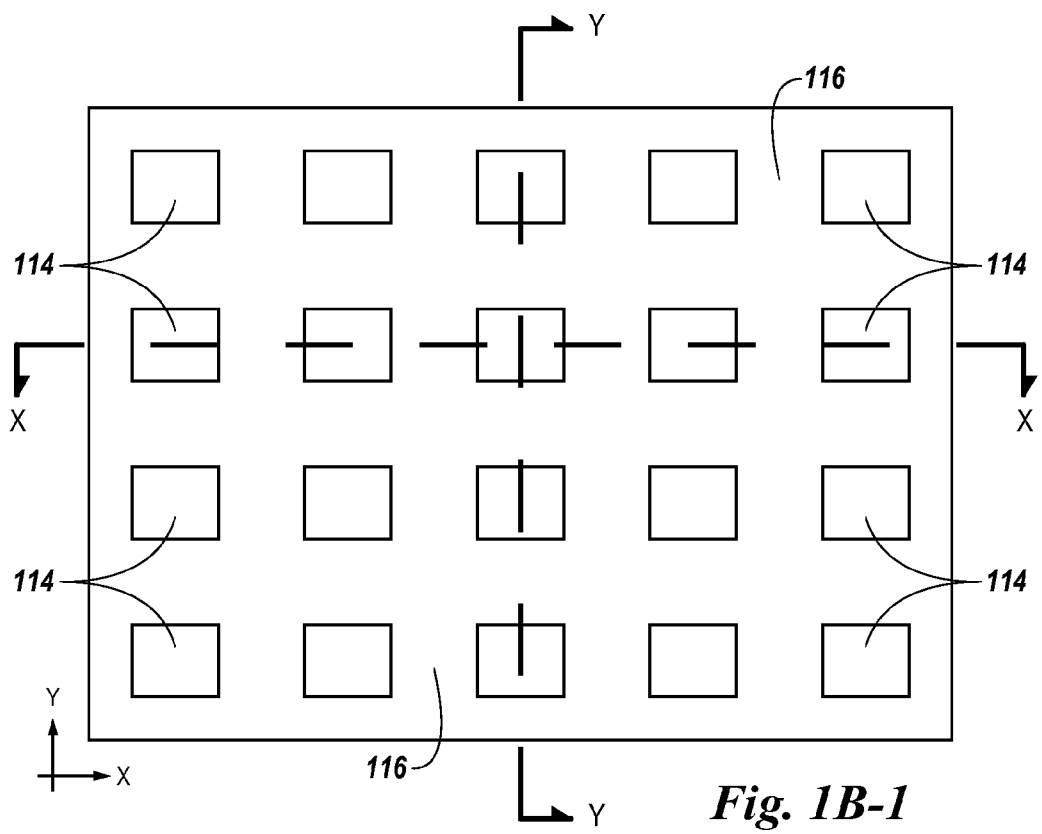
Figures 1, 1B, 2:
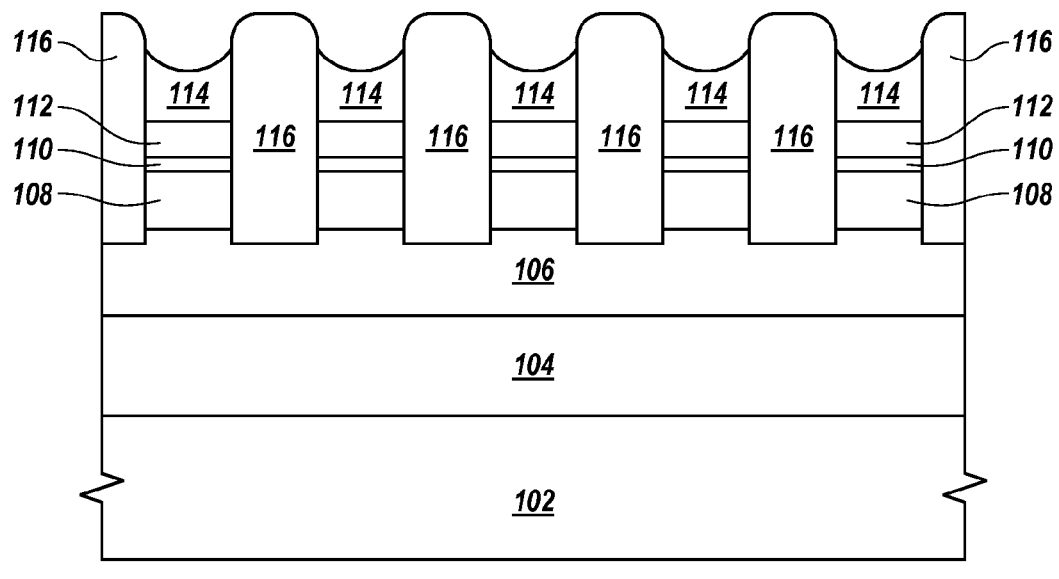
Figures 1, 1B, 2, 3:
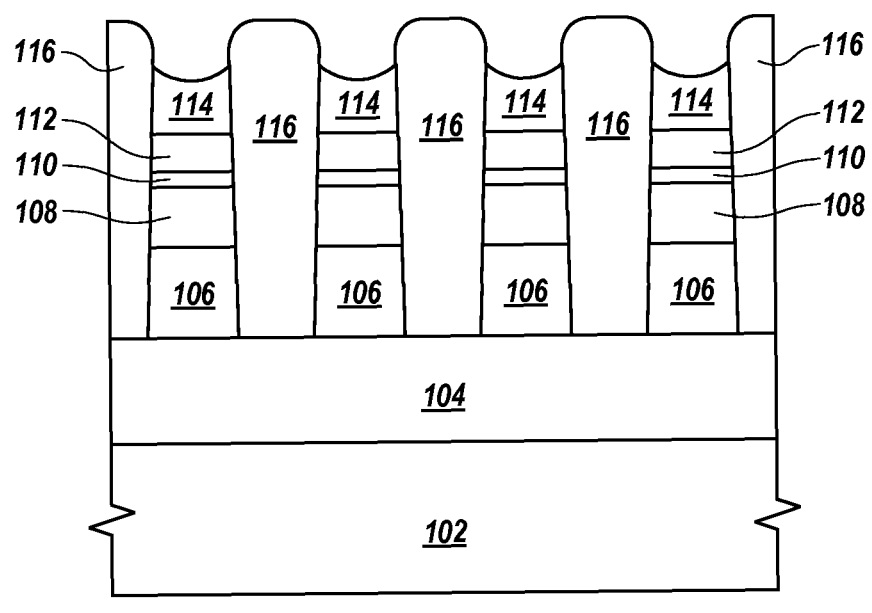
Figures 1, 1C:
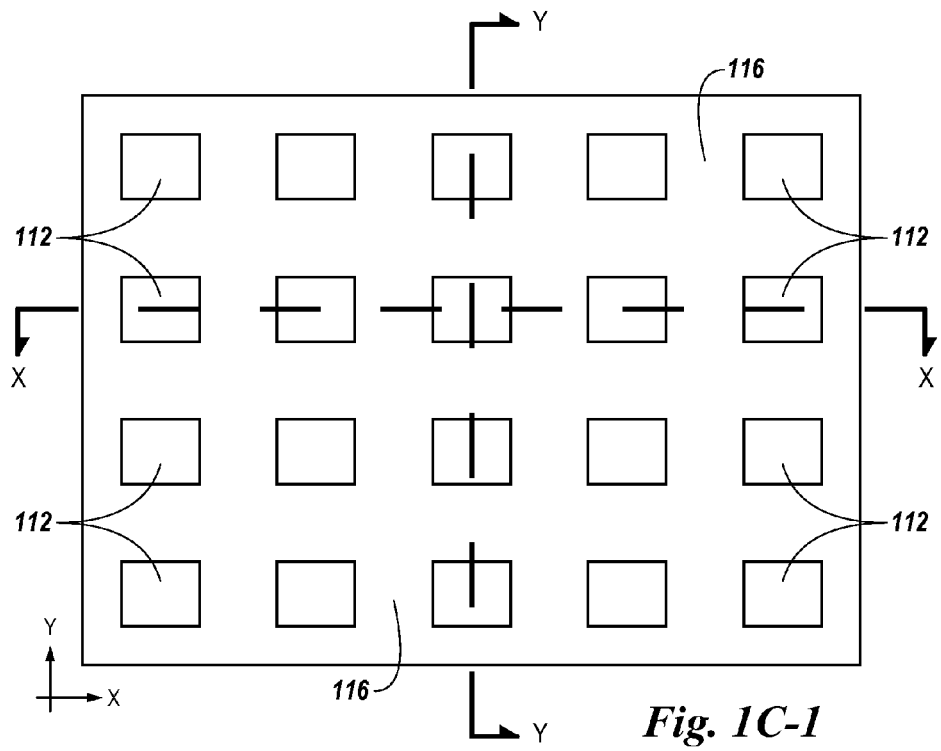
Figures 1, 1C, 2:
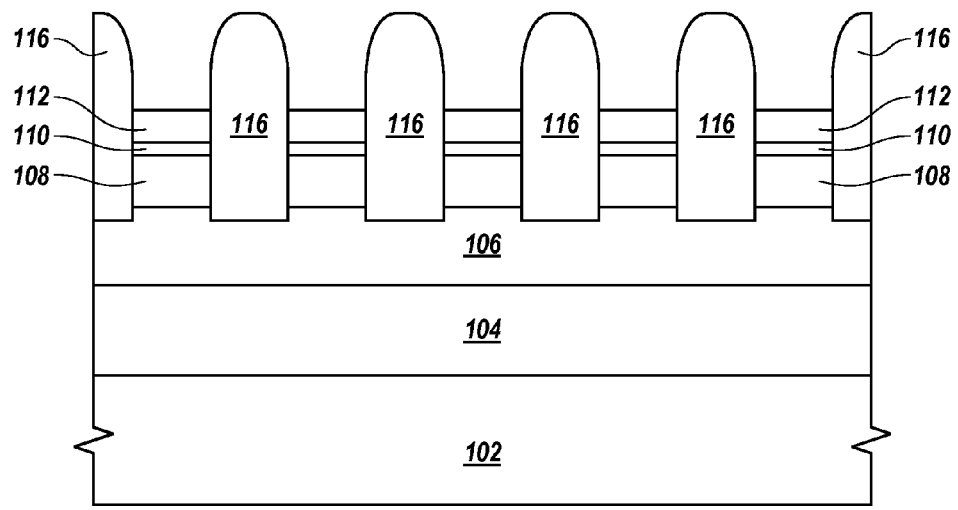
Figures 1, 1C, 2, 3:
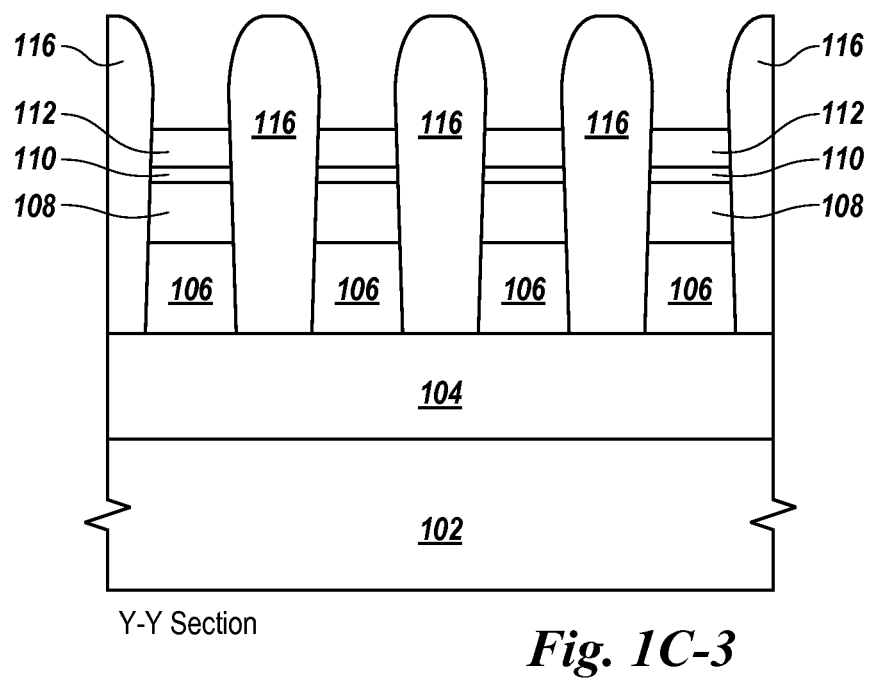
Figures 1, 1D:
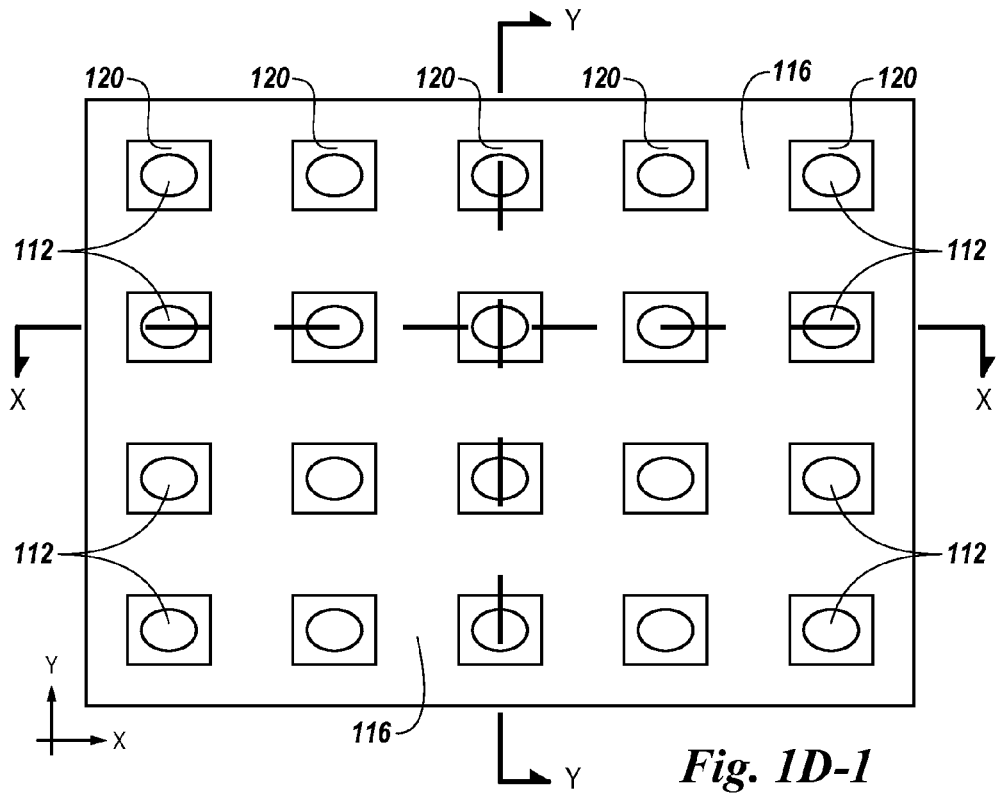
Figures 1, 1D, 2:
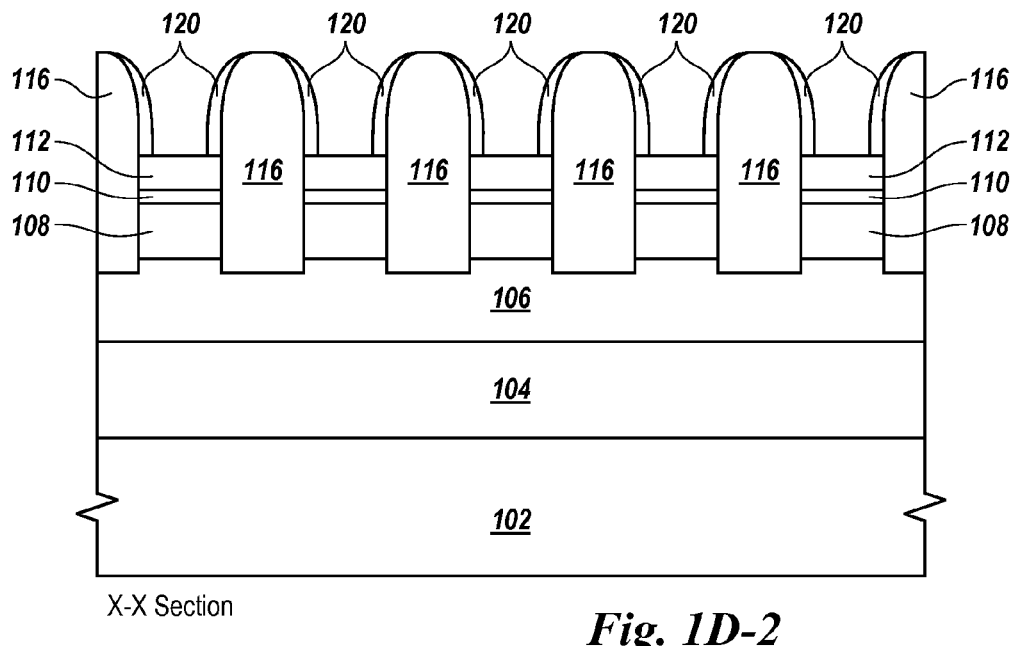
Figures 1, 1D, 2, 3:
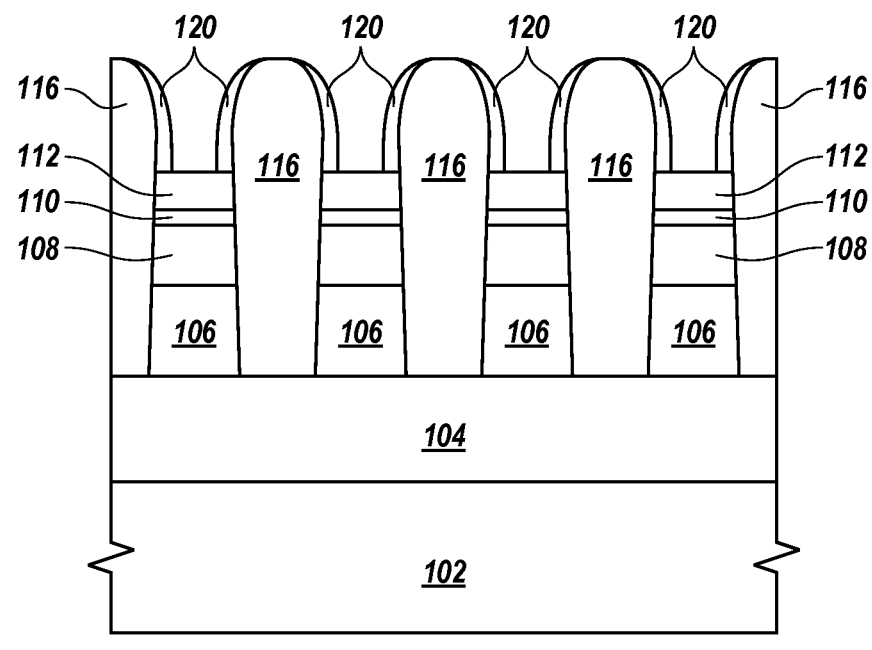
Figures 1, 1E:
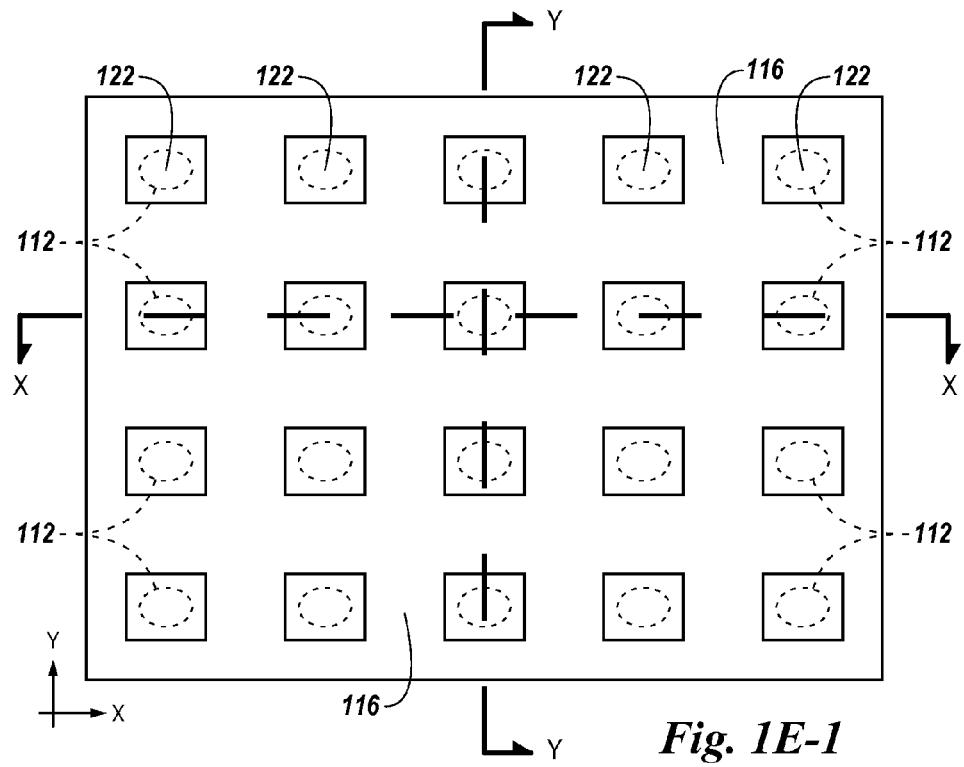
Figures 1, 1E, 2:
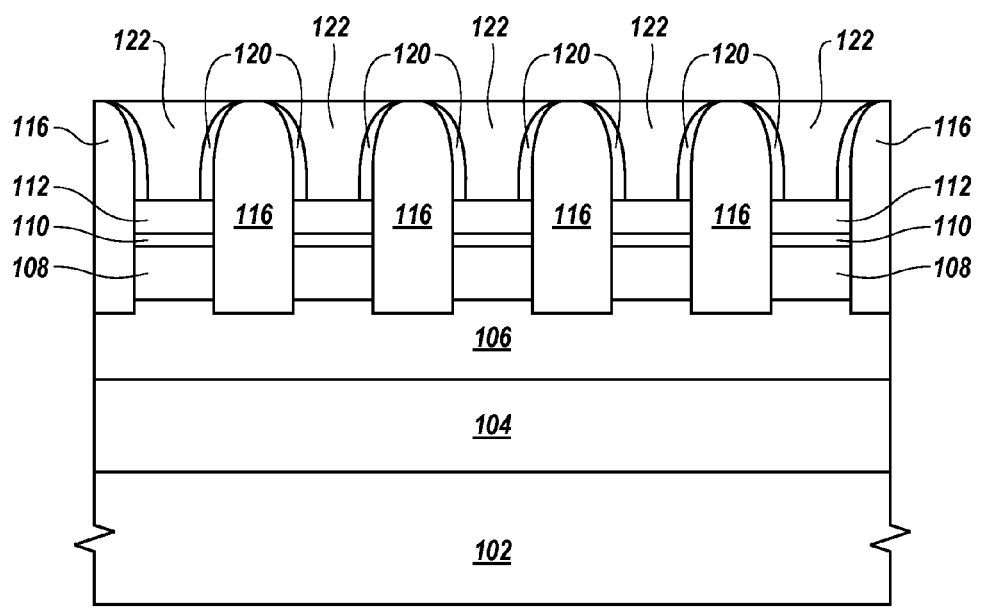
Figures 1, 1E, 2, 3:
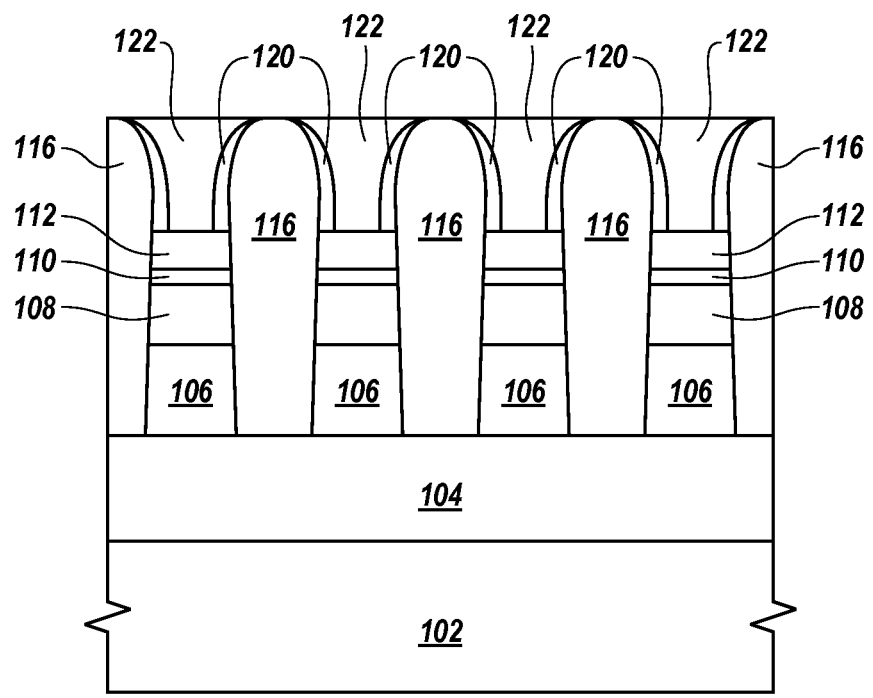
Figures 1, 1F:
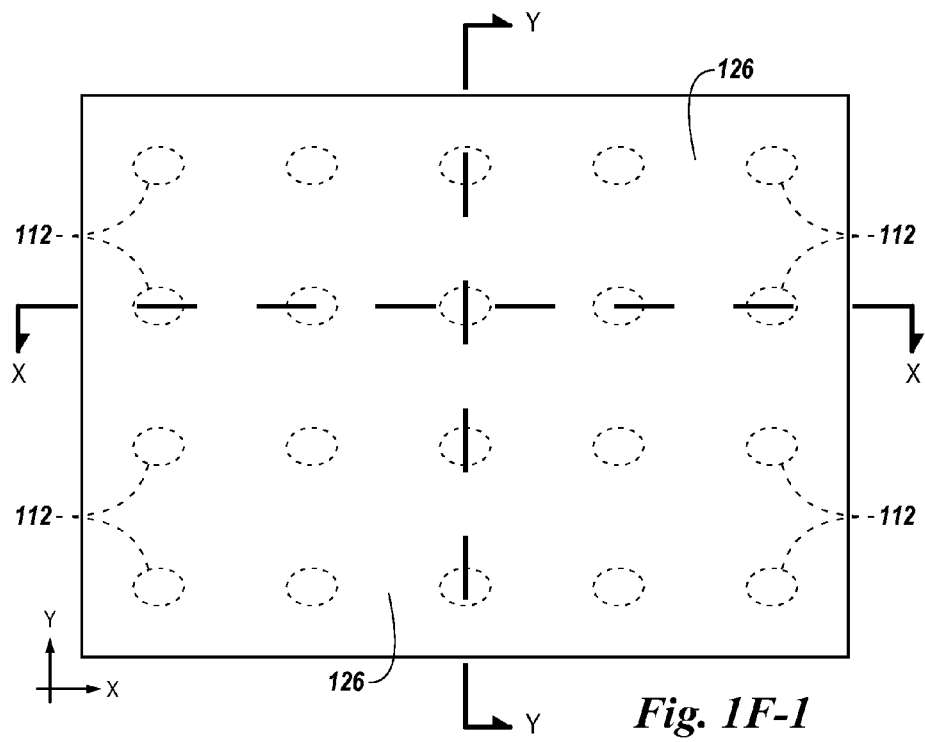
Figures 1, 1F, 2:
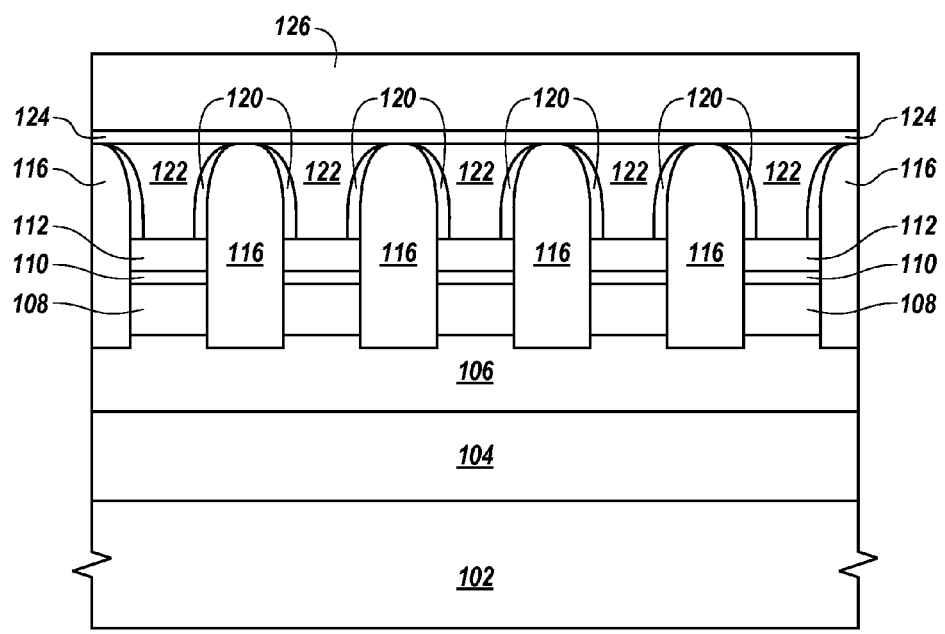
Figures 1, 1F, 2, 3:
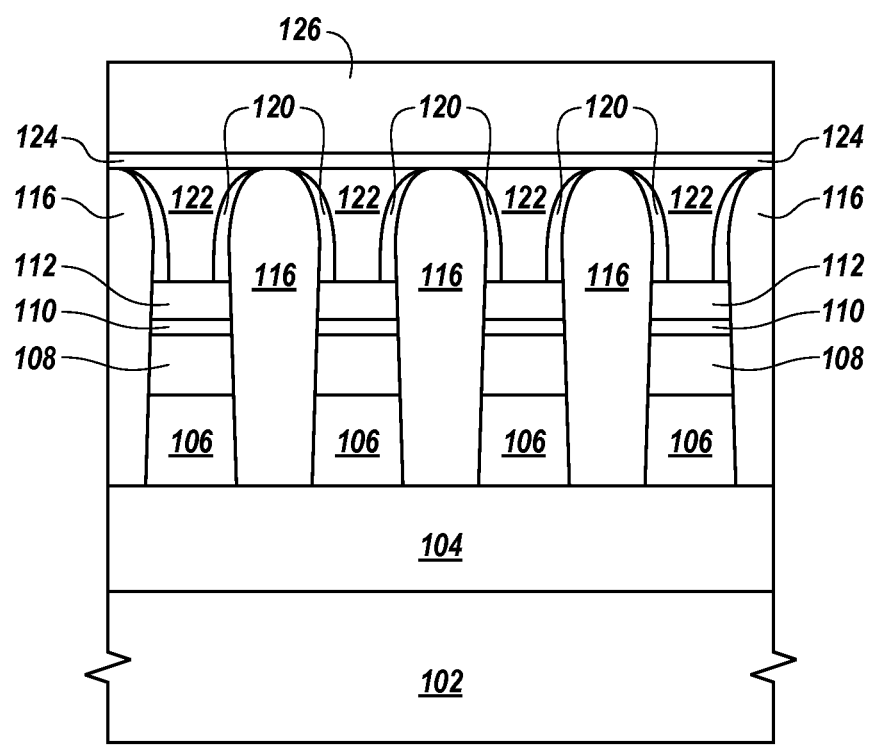
Figures 1, 1G:
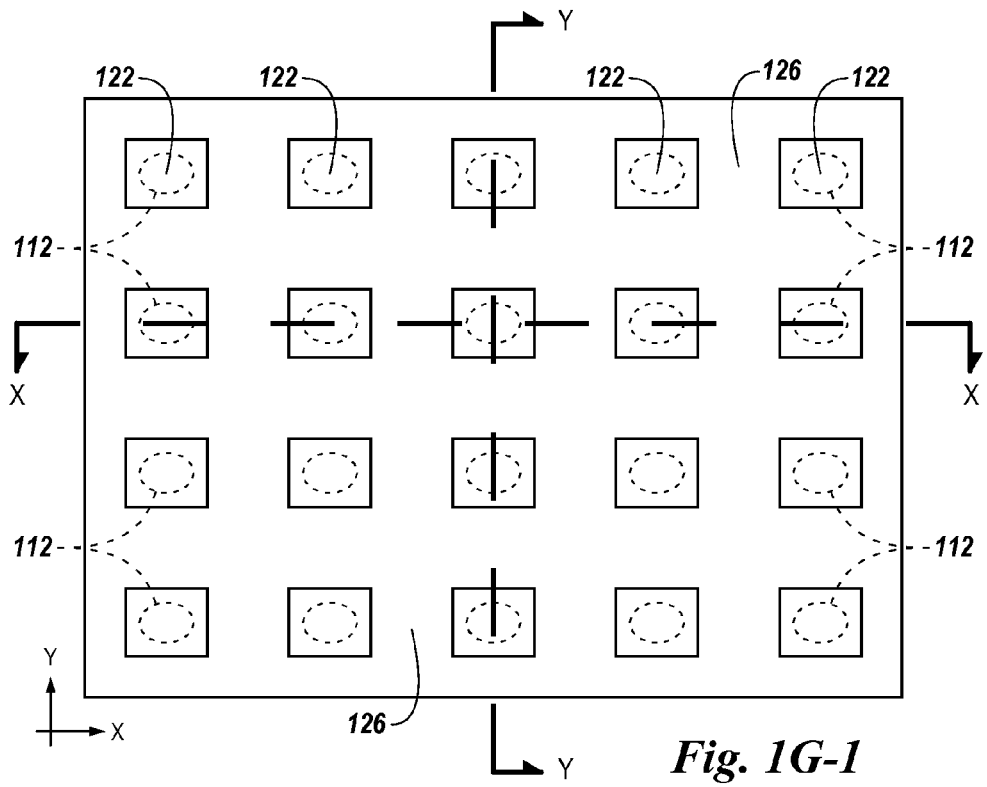
Figures 1, 1G, 2:
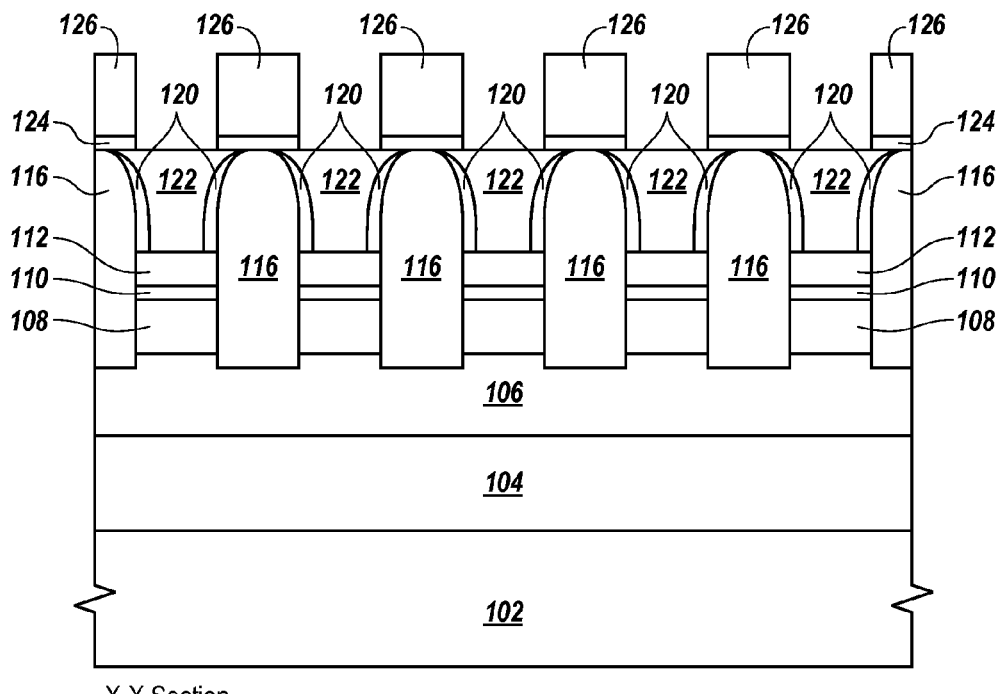
Figures 1, 1G, 2, 3:
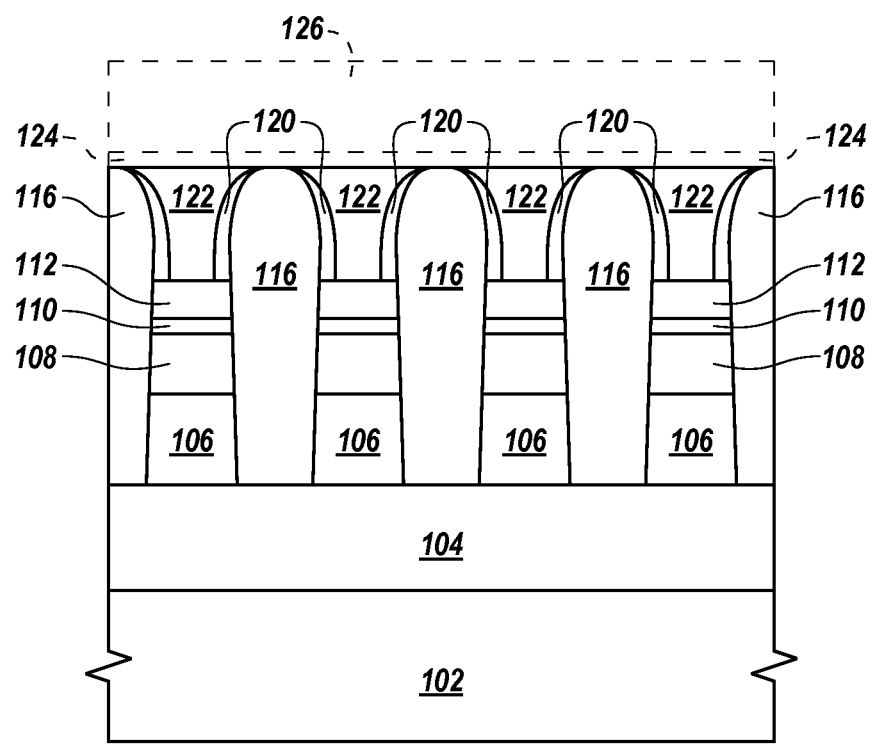
Figures 1, 1H:
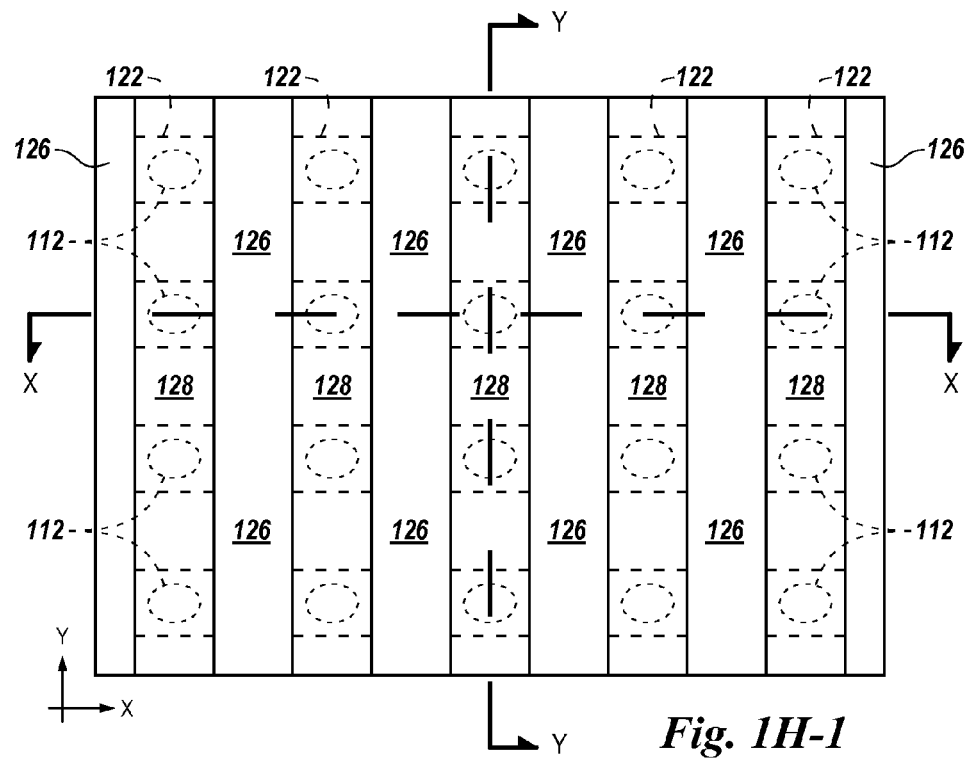
Figures 1, 1H, 2:
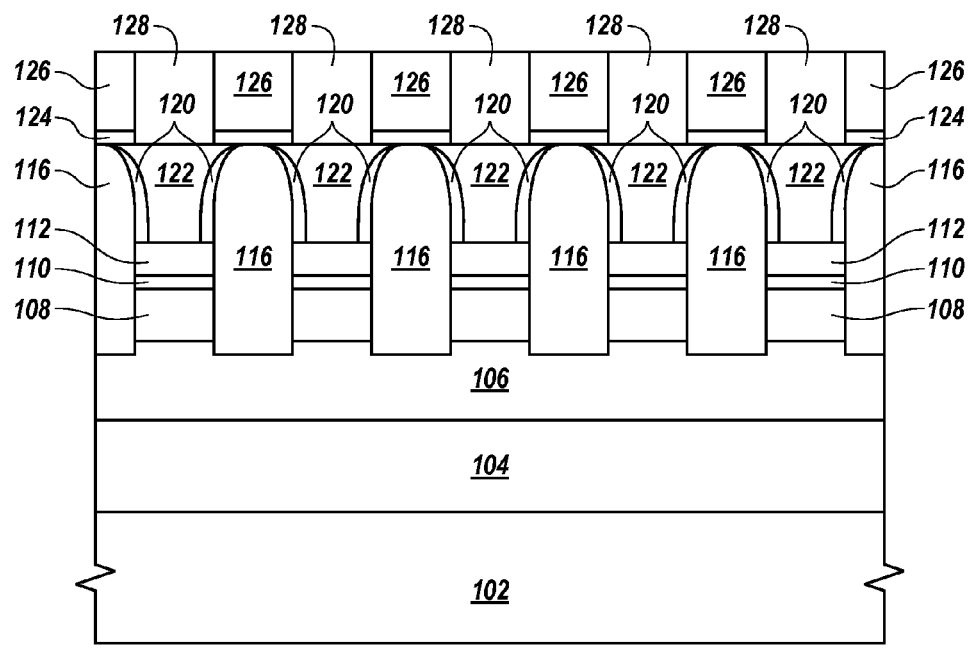
Figures 1, 1H, 2, 3:
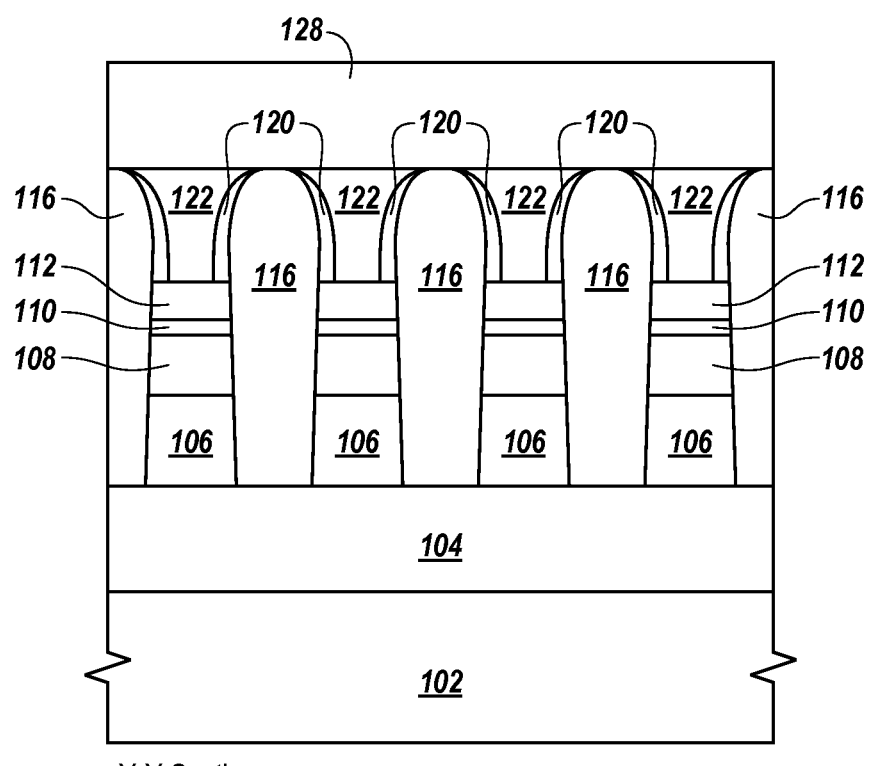
Figures 1, 2A:
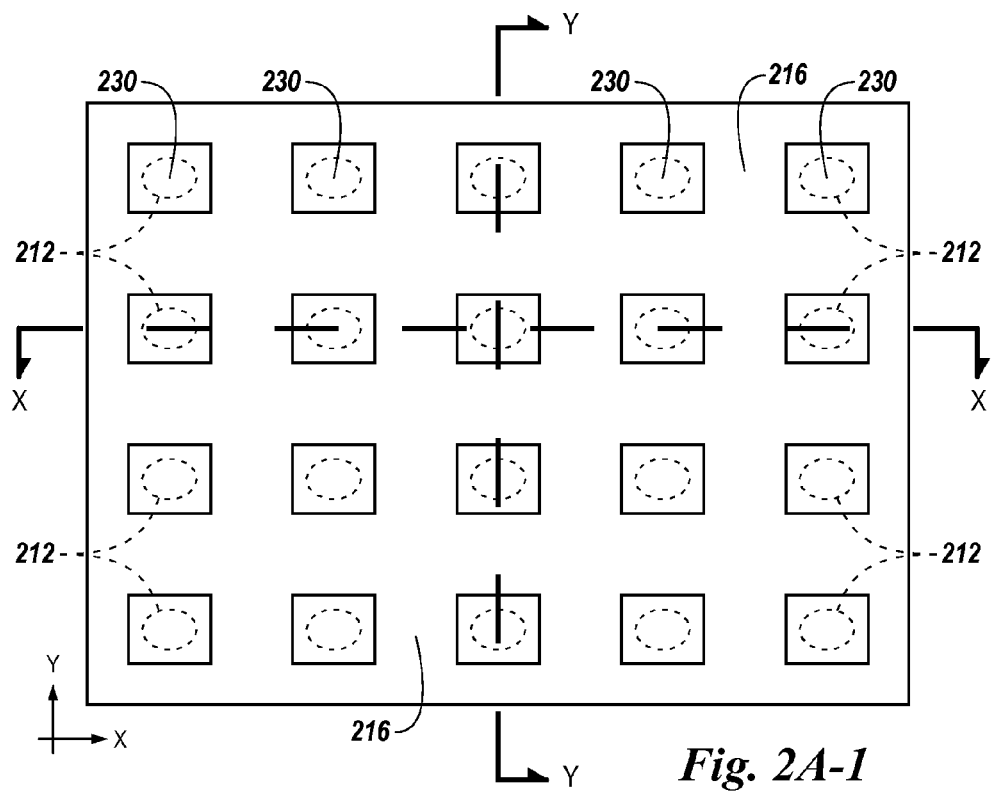
Figures 2, 2A:
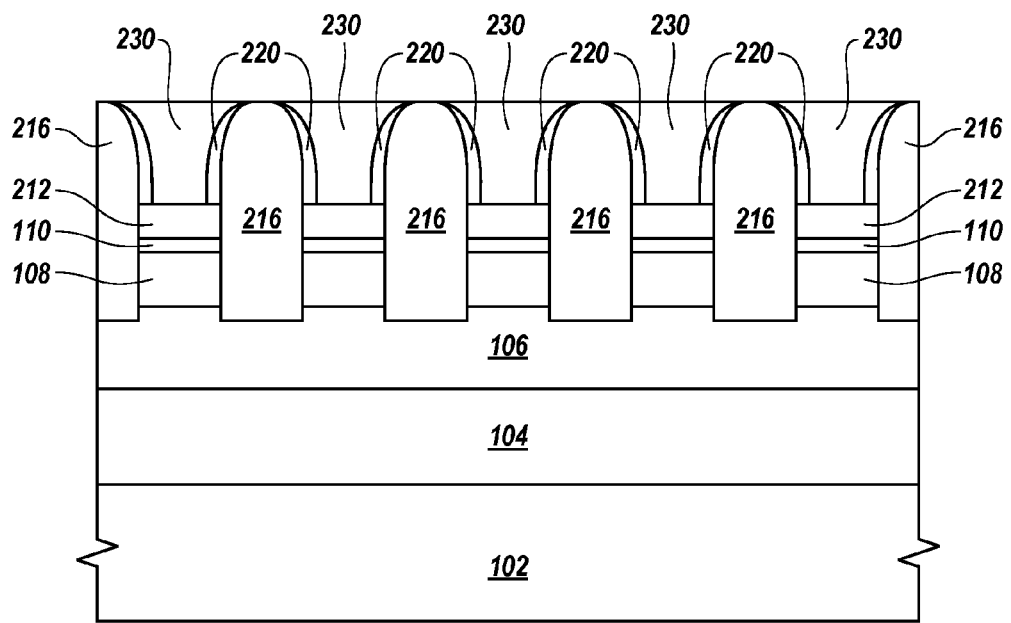
Figures 2, 2A, 3:
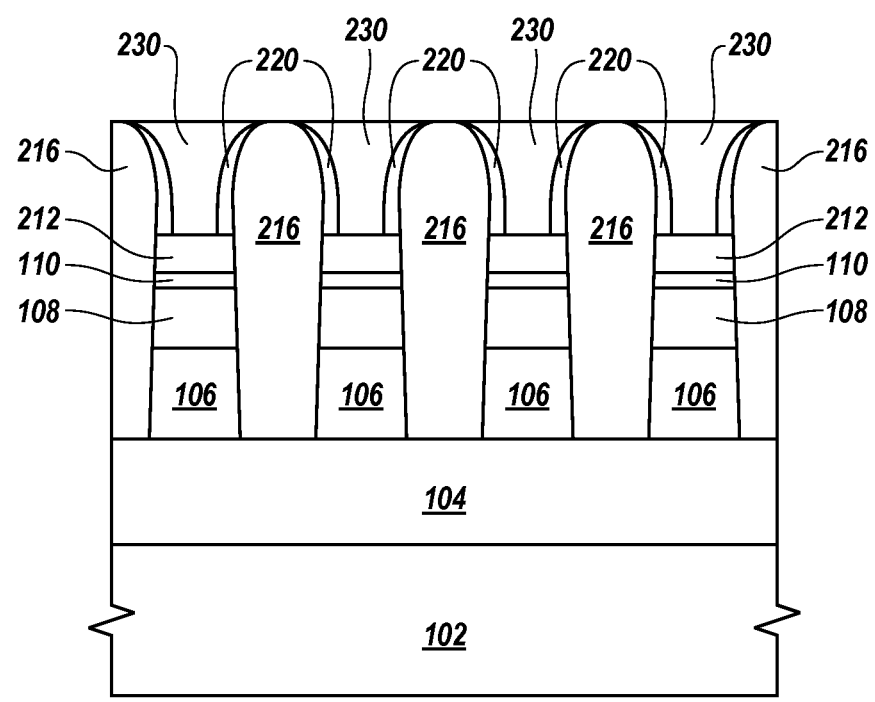
Figures 1, 2B:
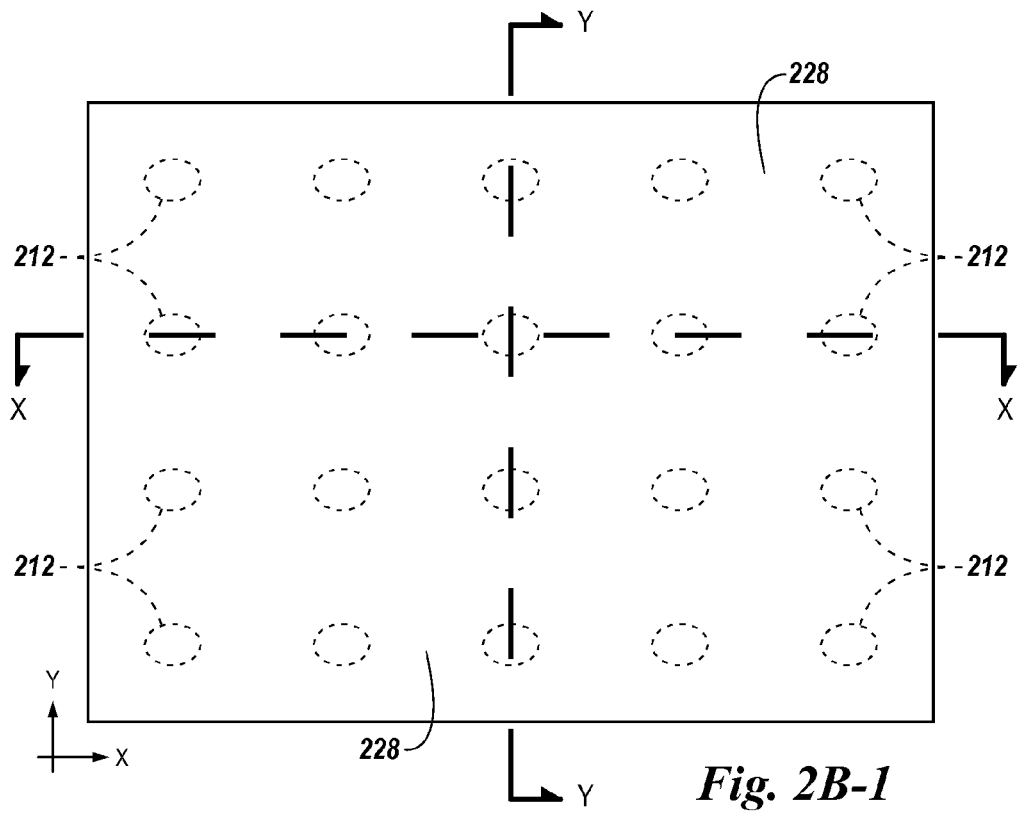
Figures 2, 2B:
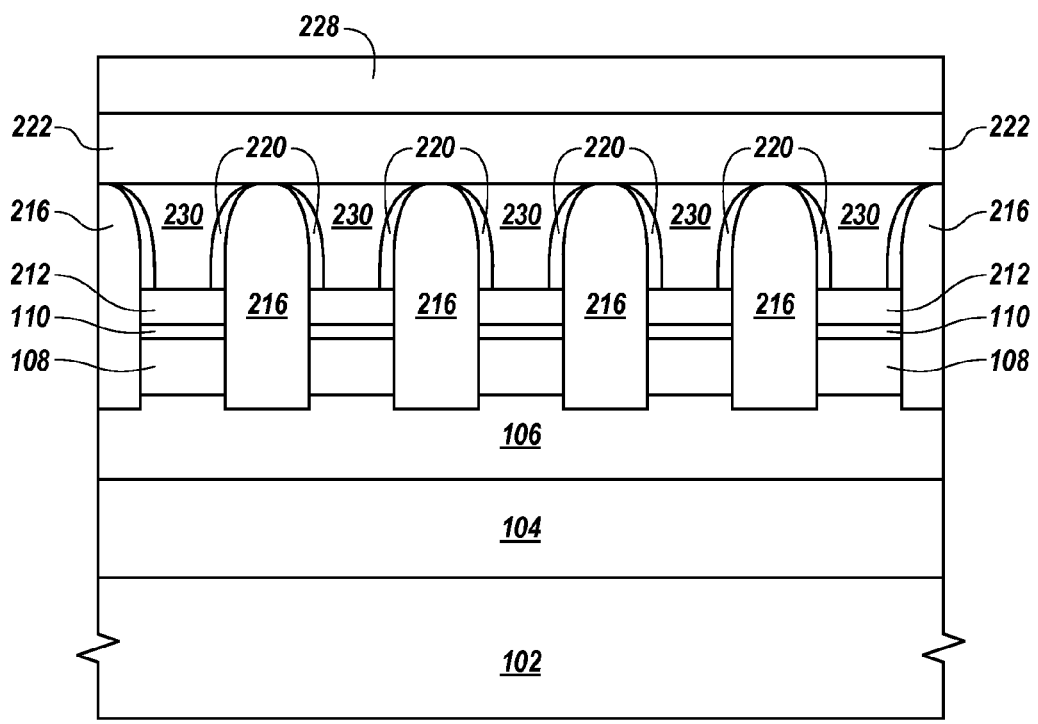
Figures 2, 2B, 3:
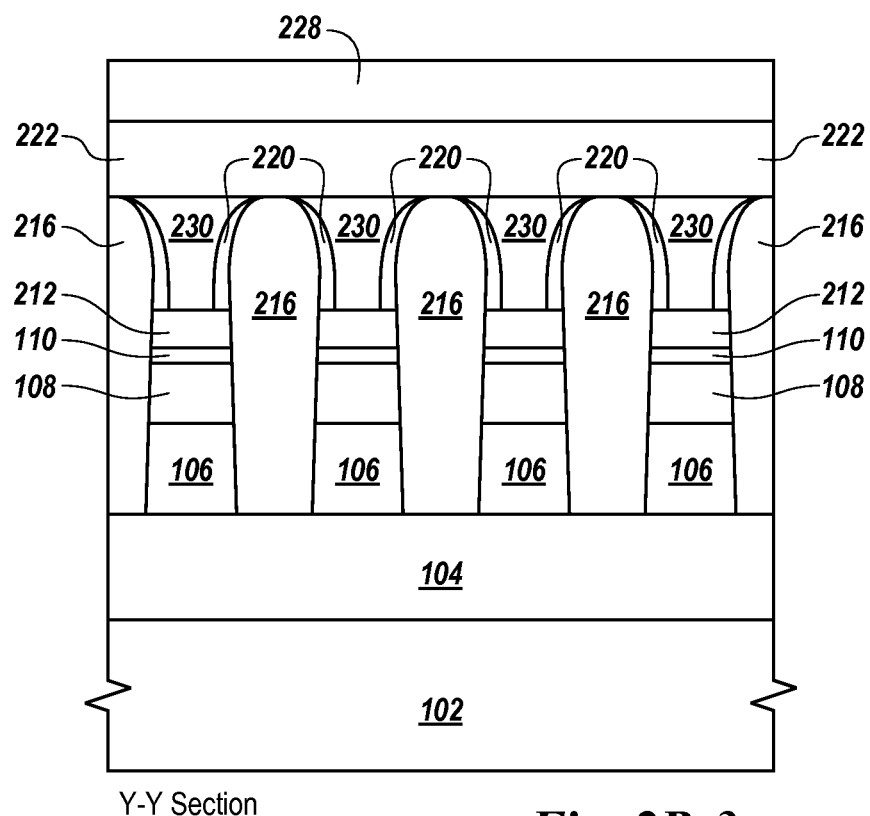
Figures 1, 2C:
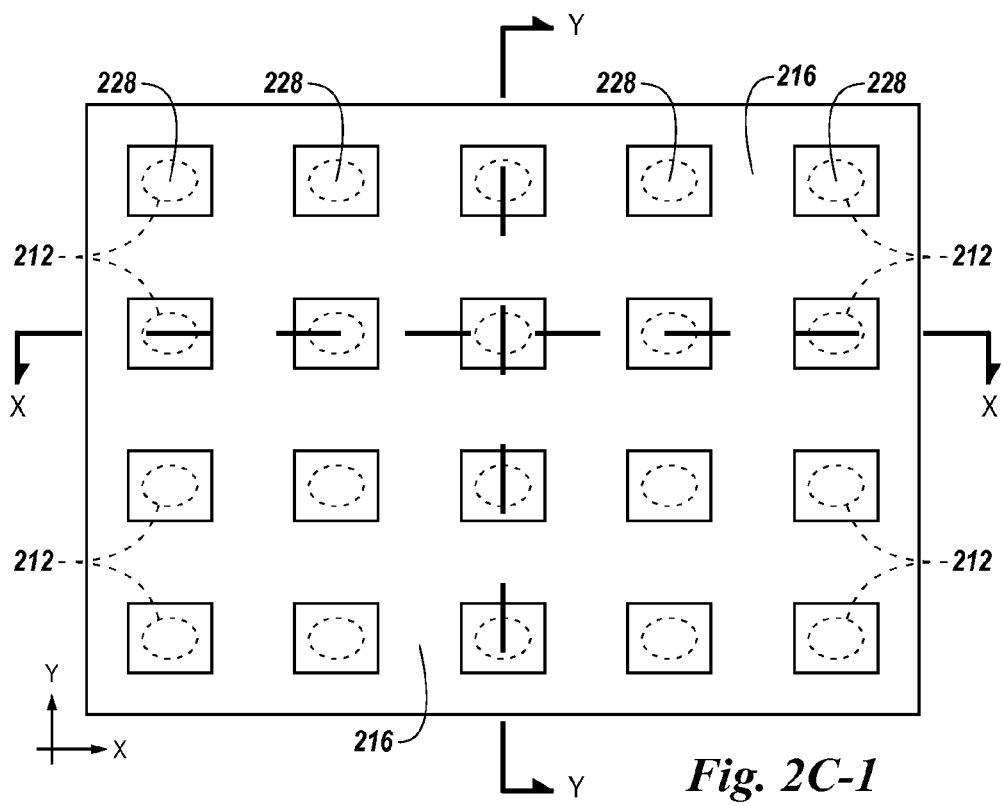
Figures 2, 2C:
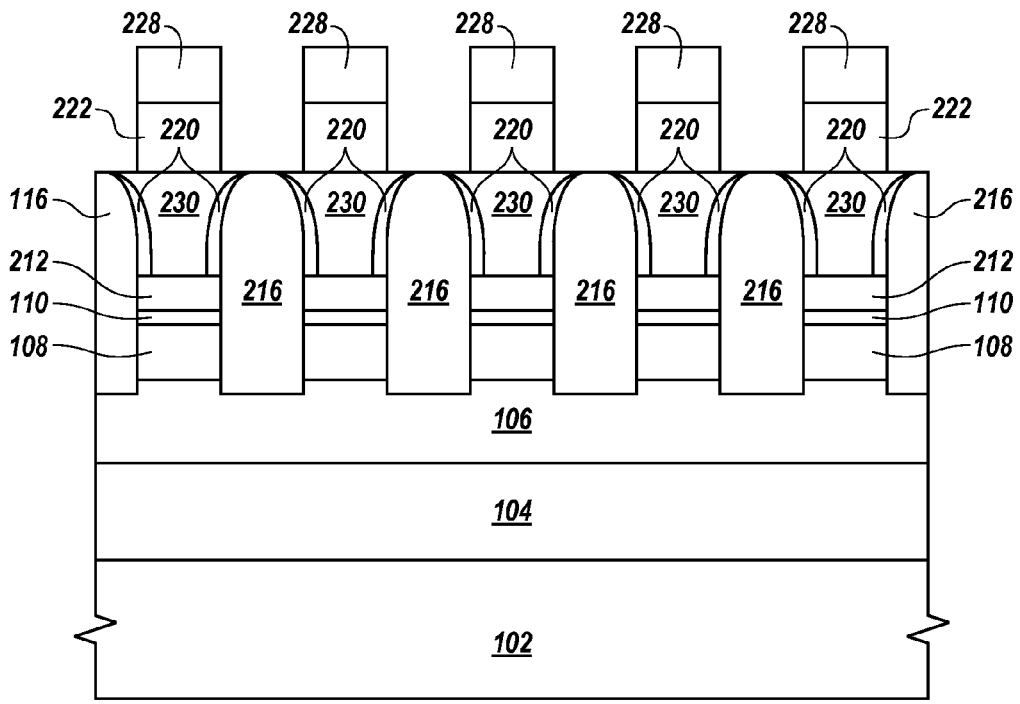
Figures 2, 2C, 3:
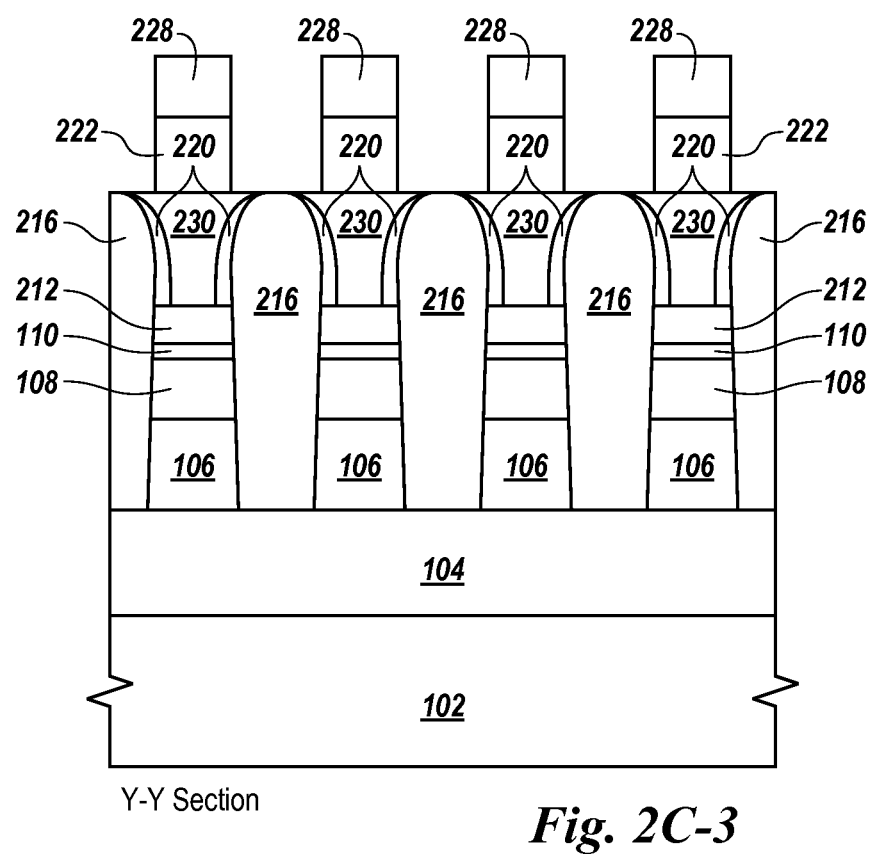
Figures 1, 2D:
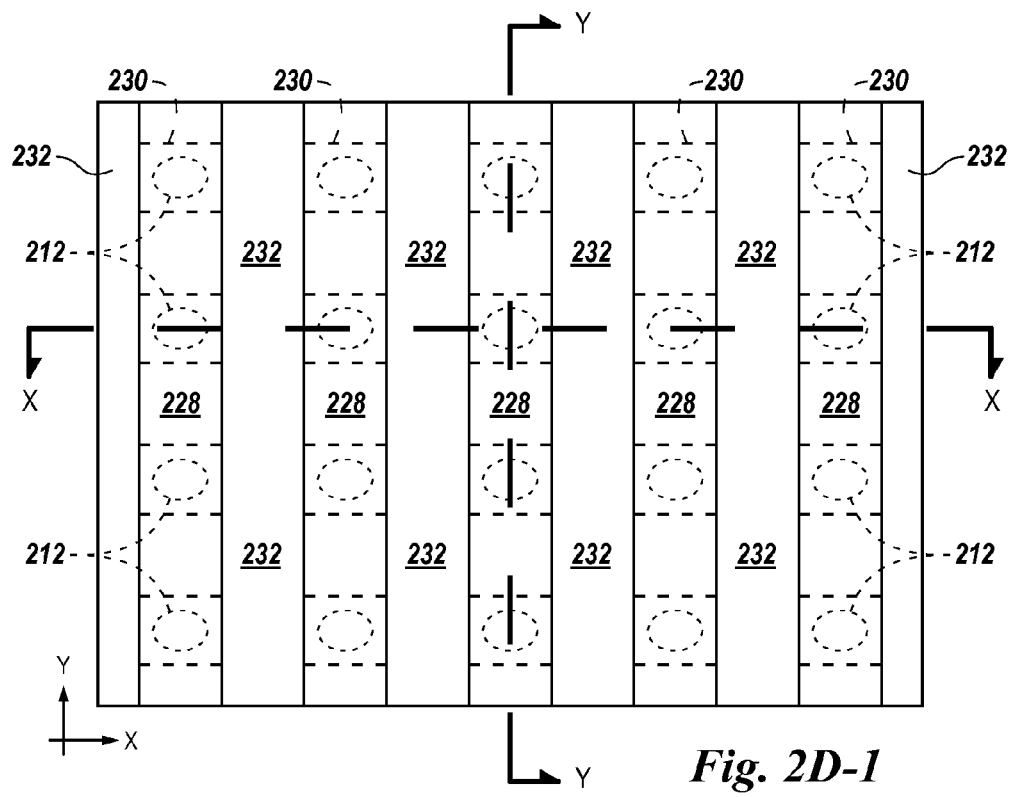
Figures 2, 2D:
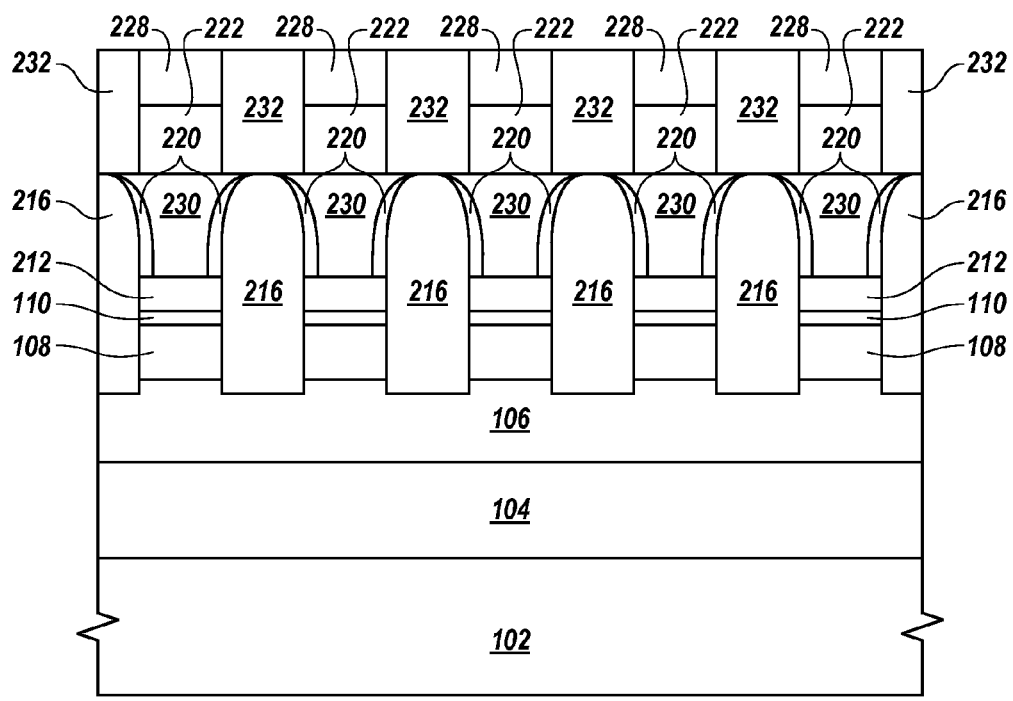
Figures 2, 2D, 3:
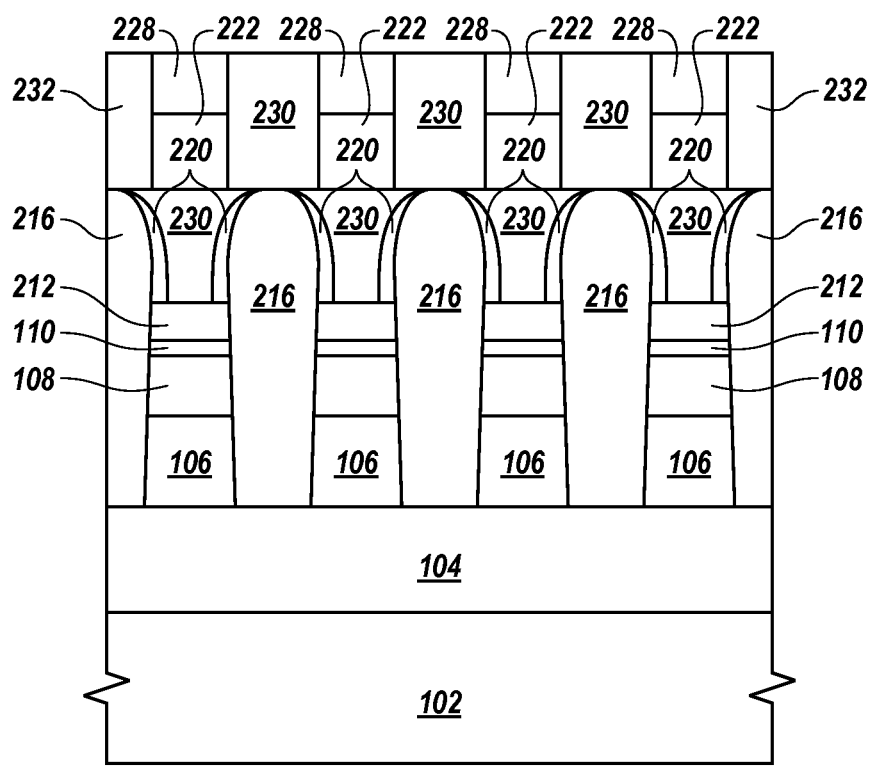
Figure 3:
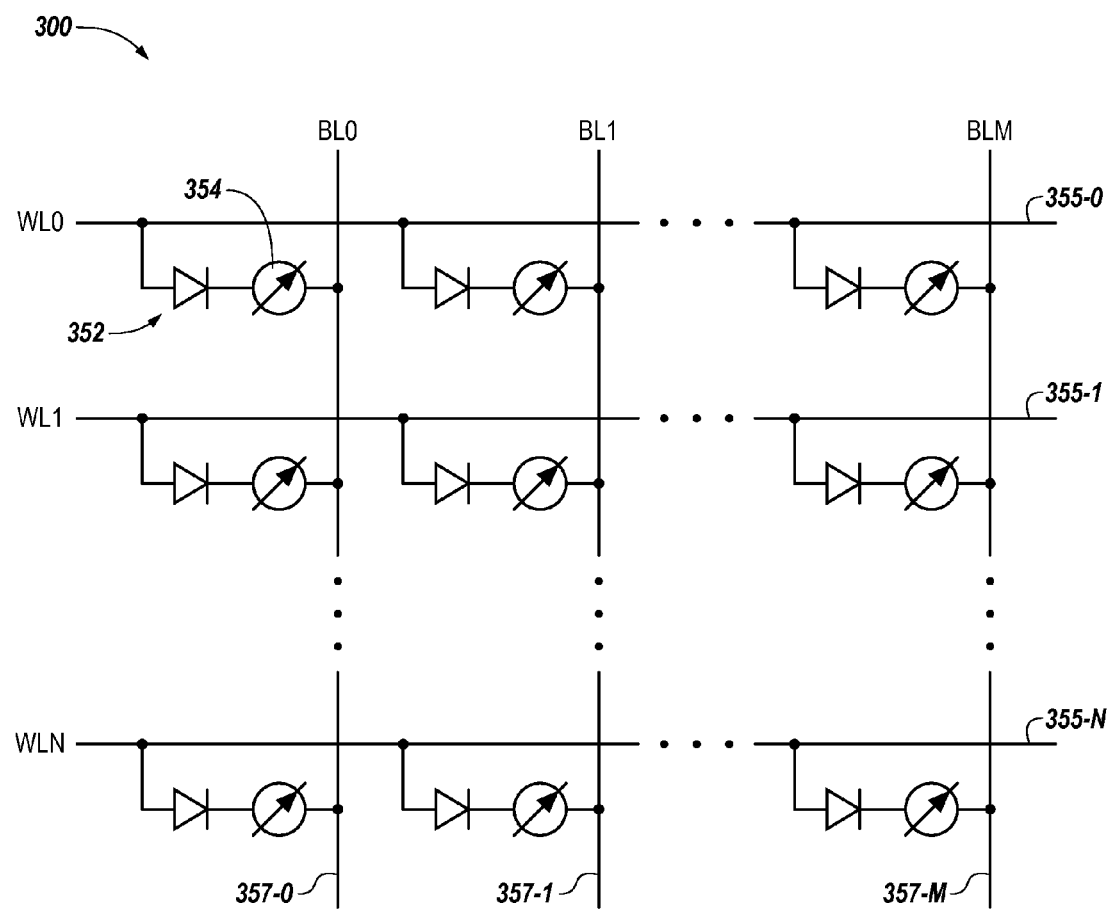

FIGS. 2B-1, 2B-2, 2B-3, and 2B-4 illustrate a further process step in forming phase change memory cells in accordance with embodiments of the present disclosure. As illustrated in FIG. 2B, phase change material 222 can be formed over dielectric 216 and conductive material 230. Top electrode material 228 can be formed over the phase change material 222. The top electrode material can be formed using atomic layer deposition (ALD), among other suitable processes. The top electrode material 228 can be titanium nitride (TiN) or tungsten (W), among other materials. The top electrode material 228 can be the top electrode for the memory cells in the memory array and can be the bit line for the memory cells in the memory array.

FIGS. 2C-1, 2C-2, 2C-3, and 2C-4 illustrate further process steps in forming phase change memory cells in accordance with embodiments of the present disclosure. In some embodiments, portions of the phase change material 222 and top electrode material 228 can be removed via an etch process, such as RIE. The phase change material 222 and top electrode material 228 can be removed along the y-axis over the phase change material 222 to expose the dielectric 216.

FIGS. 2D-1, 2D-2, 2D-3, and 2D-4 illustrate further process steps in forming phase change memory cells in accordance with embodiments of the present disclosure. As shown, a dielectric 232 can be formed in the openings formed by removing the top electrode material 228 and the phase change material 222 as discussed above. The dielectric 232 can be formed to isolate the memory cells from adjacent memory cells. A portion of the dielectric and the top electrode material 228 can be removed via CMP to form a surface for building further access devices, memory structures and/or other related circuitry.

FIG. 3 is a schematic of a portion of a phase change memory array 300 having one or more phase change memory cells in accordance with one or more embodiments of the present disclosure. In the embodiment illustrated in FIG. 3, the memory array 300 includes a number of phase change memory cells each having an associated access device 352 and resistance variable element 354, e.g., a phase change material 354.

Access devices 352 can be operated, e.g., turned on/off, to access the memory cells in order to perform operations such as programming, e.g., writing, and/or sensing, e.g., reading, operations on the memory cells. In the embodiment illustrated in FIG. 3, access devices 352 are diodes. Diodes can include, for example, p-n diodes, Zener diodes, and Schottky diodes. Alternatively, access devices 352 can be field effect transistors (FETs) or bipolar junction transistors (BJTs), for example. Embodiments of the present disclosure are not limited to a particular type of access device 352. As shown in FIG. 3, each access device 352 associated with each memory cell is coupled to one of a number of access lines 355-0 (WL0), 355-1 (WL1), . . . , 355-N (WLN) (i.e., each access line 355-0, 355-1, . . . , 355-N is coupled to a row of phase change memory cells). The access lines 355-0, 355-1, . . . , 355-N may be referred to herein as "word lines." The designator "N" is used to indicate that a memory array can include a number of word lines.

The resistance variable elements 354 can be a phase change chalcogenide alloy such as a Germanium-Antimony-Tellurium (GST) material, e.g., a Ge—Sb—Te material such as $Ge_2Sb_2Te_5$, $Ge_2Sb_2Te_7$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—

Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

In the embodiment illustrated in FIG. 3, each resistance variable element 354 is coupled to one of a number of data lines 357-0 (BL0), 357-1 (BL1), . . . , 357-M (BLM) (i.e., each data line 357-0, 357-1, . . . , 357-M is coupled to a column of phase change memory cells). The data lines 357-0, 357-1, . . . , 357-M may be referred to herein as "bit lines" or "sense lines." The designator "M" is used to indicate that a memory array can include a number of bit lines. For ease of addressing in the digital environment, the number of word lines 355-1, . . . , 355-N and the number of bit lines 357-1, . . . , 357-M can each be some power of two, e.g., 256 word lines by 4,096 bit lines. However, embodiments are not limited to particular numbers of word lines and/or bit lines.

In operation, appropriate voltage and/or current signals, e.g., pulses, can be applied to the bit lines 357-0, 357-1, . . . , 357-M and word lines 355-0, 355-1, . . . , 355-N in order to program data to and/or read data from the phase change memory cells of the array 300. As an example, the data stored by a phase change memory cell of array 300 can be determined by turning on an access device 352 and sensing a current passing through the phase change element 354. The current sensed on the bit line associated with the memory cell being read corresponds to a resistance level of the phase change element 354, which in turn corresponds to a particular data value, e.g., a binary value such as 1, 0, 001, 111, 1011, etc.

Embodiments of the present disclosure are not limited to the example array 300 illustrated in FIG. 3. For example, the access device 352 associated with a particular memory cell can be a device other than a MOSFET. In some embodiments, the access device 352 can be a bipolar junction transistor (BJT) or a diode, e.g., p-n diode, a Schottky diode, or a Zener diode, among other types of access devices. Although not illustrated in FIG. 3, one of ordinary skill in the art will appreciate that the phase change memory array 300 can be coupled to other memory components including a controller and various write/read circuitry and/or other control circuitry.

Methods, devices, and systems associated with phase change material memory are described herein. In one or more embodiments, a method of forming a phase change material memory cell includes forming a number of memory structure regions, wherein the memory structure regions include a bottom electrode material and a sacrificial material, forming a number of insulator regions between the number of memory structure regions, forming a number of openings between the number of insulator regions and forming a contoured surface on the number of insulator regions by removing the sacrificial material and a portion of the number of insulator regions, forming a number of dielectric spacers on the number of insulator regions, forming a contoured opening between the number of insulator regions and exposing the bottom electrode material by removing a portion of the number of dielectric spacers, and forming a phase change material in the opening between the number of insulator regions.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of one or more of the associated listed items.

It will be understood that, although the terms first, second, etc. may be used herein to describe various elements and that these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
a phase change material between a first electrode and a second electrode, wherein the phase change material includes contoured sidewalls that contact a first spacer and a second spacer, wherein the first and second spacers include contoured sidewalls, wherein the first spacer is in contact with a first insulator region and the second spacer is in contact with a second insulator region, wherein the first insulator region includes a first contoured sidewall and a second contoured sidewall and the second insulator region includes a third contoured sidewall, and wherein an adjacent memory cell is formed between the second contoured sidewall of the first insulator region and a third insulator region.

2. The memory cell of claim 1, wherein the phase change material contacts the first electrode in a self-aligned opening between the number of insulator regions.

3. The memory cell of claim 1, wherein the first spacer and the second spacer further define the distance between the first insulator region and the second insulator region.

4. The memory cell of claim 1, wherein an amount of phase change material in the memory device is defined by the distance between the number of spacers.

5. The memory cell of claim 1, wherein the memory device is part of an array of memory devices.

6. The memory cell of claim 1, wherein the memory device is insulated from the adjacent memory devices by a dielectric material that forms the second insulator region.

7. The memory cell of claim 1, wherein a contact area between the phase change material and the first electrode is defined by the first spacer and the second spacer.

8. A memory cell, comprising:
a phase change material in contact with a conductive material, wherein the conductive material contacts a first electrode in an opening between a first insulator region and a second insulator region, wherein the conductive material includes contoured sidewalls that contact a first spacer and a second spacer, wherein the first and second spacers include contoured sidewalls, wherein the first spacer is in contact with the first insulator region and the second spacer is in contact with the second insulator region, wherein the first insulator region includes a first contoured sidewall and the second insulator region includes a second contoured sidewall, and wherein the phase change material is between the first electrode and a second electrode.

9. The memory cell of claim 8, wherein the conductive material is in a self-aligned opening between the number of insulator regions.

10. The memory cell of claim 8, wherein the first spacer and the second spacer further define the distance between the first insulator region and the second insulator region.

11. The memory cell of claim 8, wherein the phase change material contacts the conductive material at an upper surface of the conductive material between the first and second insulator regions that include the first and second spacers.

12. The memory cell of claim 11, wherein a contact surface between the phase change material and the conductive material is defined by the distance between the first and second insulator regions.

13. The memory device of claim 8, wherein a contact area between the first electrode and the conductive material is defined by the distance between the first and second spacers.

14. An array of memory cells, comprising:
a first memory cell including a first phase change material between a first electrode and a second electrode, wherein the first phase change material is formed in a first self-aligned opening, wherein a contoured sidewall of the first phase change material contacts a first spacer, and wherein the first spacer is formed on a first contoured sidewall of a dielectric material;
a second memory cell including a second phase change material between a third electrode and a fourth electrode, wherein the second phase change material is formed in a second self-aligned opening, wherein a contoured sidewall of the second phase change material contacts a second spacer, and wherein the second spacer is formed on a second contoured sidewall of the dielectric material.

15. The array of claim 14, wherein a contact area between the first electrode and the first phase change material is defined by the distance between the first spacer and another spacer.

16. The array of claim 14, wherein the first phase change material is a Germanium-Antimony-Tellurium (GST) material.

17. The array of claim 14, wherein the first spacer at least partially forms a contoured profile for the first opening.

18. The array of claim 14, wherein the second electrode contacts the first phase change material at an upper surface of the phase change material.

* * * * *